(12) United States Patent
Kim et al.

(10) Patent No.: US 11,342,331 B2
(45) Date of Patent: May 24, 2022

(54) SEMICONDUCTOR DEVICE INCLUDING AN AIR SPACER AND A METHOD FOR FABRICATING THE SAME

(71) Applicant: SAMSUNG ELECTRONICS CO., LTD., Suwon-si (KR)

(72) Inventors: Keun Nam Kim, Yongin-si (KR); Jin-Hwan Chun, Seongnam-si (KR); Yoo Sang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 16/891,183

(22) Filed: Jun. 3, 2020

(65) Prior Publication Data
US 2020/0395363 A1 Dec. 17, 2020

(30) Foreign Application Priority Data

Jun. 14, 2019 (KR) .................. 10-2019-0070413

(51) Int. Cl.
*H01L 27/108* (2006.01)
*H01L 23/532* (2006.01)
*H01L 21/768* (2006.01)

(52) U.S. Cl.
CPC .... *H01L 27/10814* (2013.01); *H01L 21/7682* (2013.01); *H01L 23/53295* (2013.01); *H01L 27/10855* (2013.01); *H01L 27/10885* (2013.01); *H01L 27/10888* (2013.01); *H01L 27/10823* (2013.01)

(58) Field of Classification Search
CPC ......... H01L 27/10814; H01L 27/10873; H01L 27/10855; H01L 27/10885; H01L 29/0649; H01L 27/10808; H01L 27/10835; H01L 27/1087; H01L 27/10876; H01L 27/10888; H01L 21/76837; H01L 21/7682; H01L 21/76829; H01L 21/76852; H01L 21/76816; H01L 23/53295; H01L 27/10823; H01L 21/76897; H01L 27/10829; H01L 27/10838; H01L 27/10861; G11C 5/063; G11C 7/18
See application file for complete search history.

(56) References Cited

U.S. PATENT DOCUMENTS

| | | |
|---|---|---|
| 9,099,343 B2 | 8/2015 | Kim et al. |
| 9,379,004 B1 | 6/2016 | Kwon et al. |
| 9,418,998 B2 * | 8/2016 | Kim ............... H01L 21/768 |
| 9,627,387 B2 | 4/2017 | Jung et al. |
| 9,837,490 B2 | 12/2017 | Park et al. |

(Continued)

*Primary Examiner* — Jonathan Han
(74) *Attorney, Agent, or Firm* — F. Chau & Associates, LLC

(57) ABSTRACT

A semiconductor device is provided including a substrate including a trench. A first conductive pattern is disposed within the trench. The first conductive pattern has a width smaller than a width of the trench. A first spacer extends along at least a portion of a side surface of the first conductive pattern and the trench. A second spacer at least partially fills the trench adjacent to the first spacer. An air spacer is provided including a first portion between the first spacer and the second spacer, and a second portion disposed on the second spacer and the first portion. A width of the second portion of the air spacer is greater than a width of the first portion of the air spacer.

20 Claims, 24 Drawing Sheets

(56) References Cited

U.S. PATENT DOCUMENTS

| | | |
|---|---|---|
| 9,847,278 B2 * | 12/2017 | Kim .................... H01L 29/0649 |
| 9,929,233 B2 | 3/2018 | Bian et al. |
| 9,972,527 B2 | 5/2018 | Kim et al. |
| 2017/0005166 A1 * | 1/2017 | Park .................. H01L 27/10888 |
| 2018/0040560 A1 | 2/2018 | Kim et al. |
| 2018/0301469 A1 | 10/2018 | Kim et al. |
| 2020/0075417 A1 * | 3/2020 | Lee ................. H01L 21/823468 |
| 2020/0091309 A1 * | 3/2020 | Lin ................. H01L 21/823468 |

* cited by examiner

SEMICONDUCTOR DEVICE INCLUDING AN AIR SPACER AND A METHOD FOR FABRICATING THE SAME

CROSS-REFERENCE TO RELATED APPLICATION

This application claims priority under 35 U.S.C. § 119 to Korean Patent Application No. 10-2019-0070413, filed on Jun. 14, 2019 in the Korean Intellectual Property Office, the disclosure of which is incorporated by reference herein in its entirety.

TECHNICAL FIELD

The present inventive concept relates to a semiconductor device and a method for fabricating the same, and more particularly, to a semiconductor device including an air spacer and a method for fabricating the same.

DISCUSSION OF THE RELATED ART

With continuously enhanced integration of a semiconductor device, separate circuit patterns are further miniaturized to implement more semiconductor devices on a same area and thus increase density.

As semiconductor memory device integration rises, parasitic capacitance and leakage current can increasingly degrade performance.

SUMMARY

According to an exemplary embodiment of the present inventive concept, a semiconductor device is provided including a substrate including a trench. A first conductive pattern is disposed within the trench. The first conductive pattern has a width smaller than a width of the trench. A first spacer extends along at least a portion of a side surface of the first conductive pattern and the trench. A second spacer at least partially fills the trench adjacent to the first spacer. An air spacer is provided including a first portion between the first spacer and the second spacer, and a second portion disposed on the second spacer and the first portion. A width of the second portion of the air spacer is greater than a width of the first portion of the air spacer.

According to an exemplary embodiment of the present inventive concept, a semiconductor device is provided including a substrate including a trench. A conductive pattern is disposed within the trench. The conductive pattern has a width smaller than a width of the trench. A first spacer extends along at least a portion of a side surface of the conductive pattern and the trench. A second spacer at least partially fills the trench and is disposed on the first spacer. An air spacer including a first portion between the first spacer and the second spacer and a second portion disposed on the second spacer and the first portion is provided. The first spacer comprises a lower spacer between the conductive pattern and the first portion of the air spacer and an upper spacer between the conductive pattern and the second portion of the air spacer. A width of the upper spacer of the first spacer is less than a width of the lower spacer of the first spacer.

According to an exemplary embodiment, of the present inventive concept, a semiconductor device is provided including a substrate including a trench. A conductive pattern is disposed within the trench. The conductive pattern has a width smaller than a width of the trench. A first spacer extends along at least a portion of a side surface of the conductive pattern and the trench. An air spacer is displaced from the conductive pattern by the first spacer, the air spacer extends along at least a portion of the first spacer. The air spacer has a T shape in a cross section, and a portion of the air spacer is formed within the trench.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Figure 1:
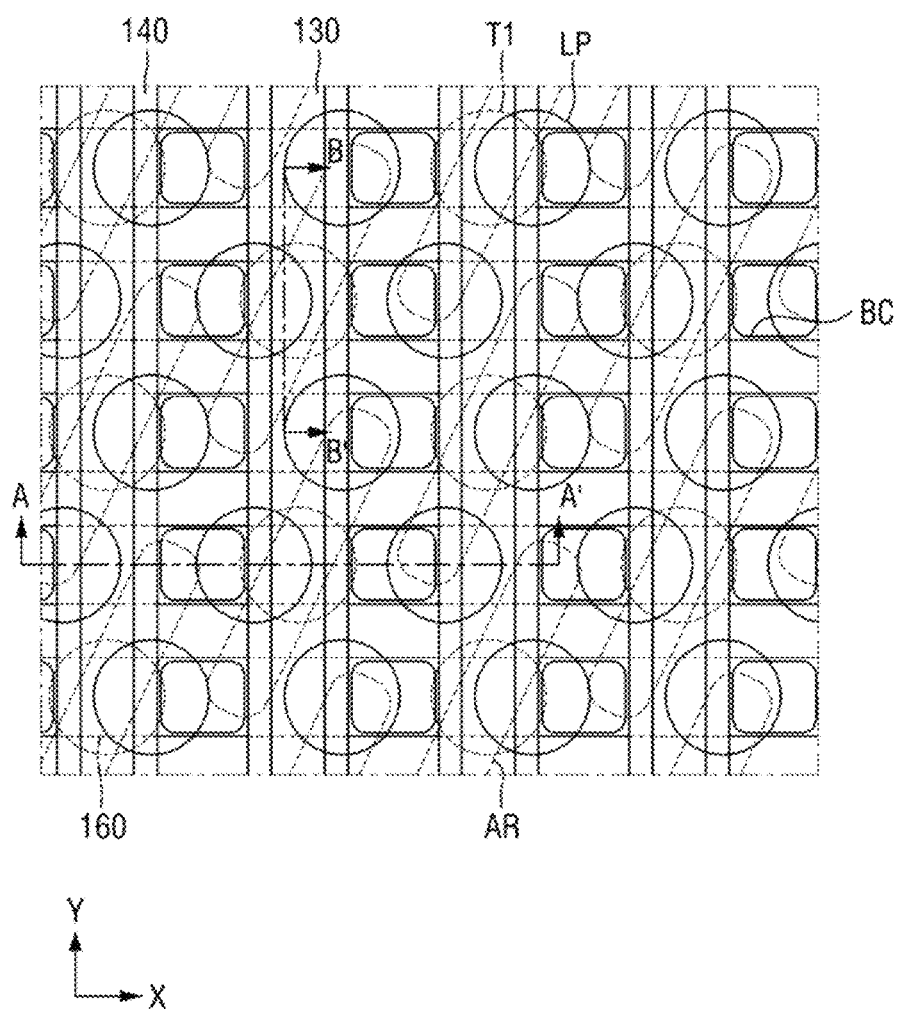
FIG. 1 is a plan view of a semiconductor device according to an exemplary embodiment of the present inventive concept.
Figure 2:
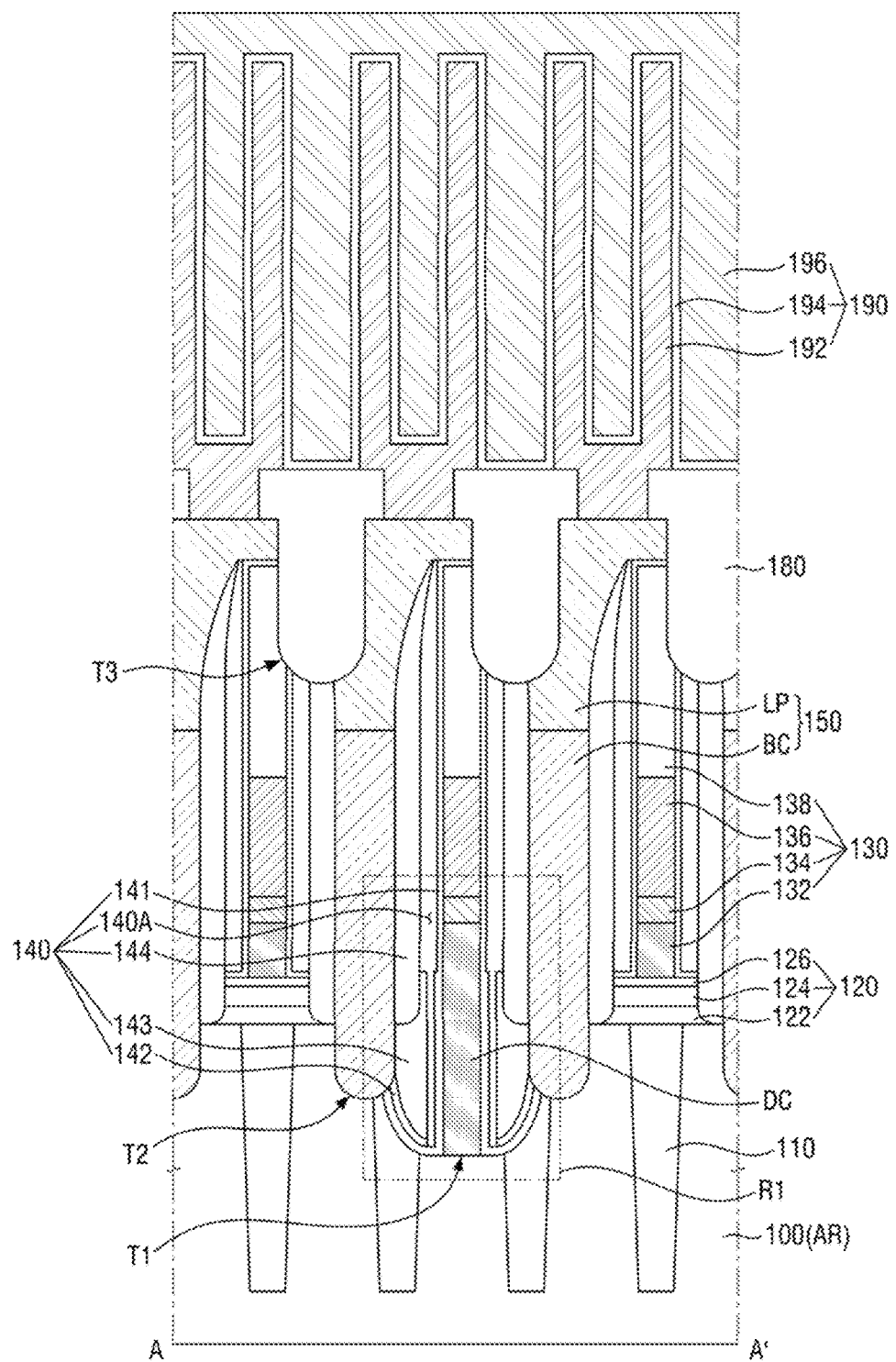
FIG. 2 is a cross sectional view taken along line A-A' of FIG. 1 according to an exemplary embodiment of the present inventive concept.
Figure 3A:
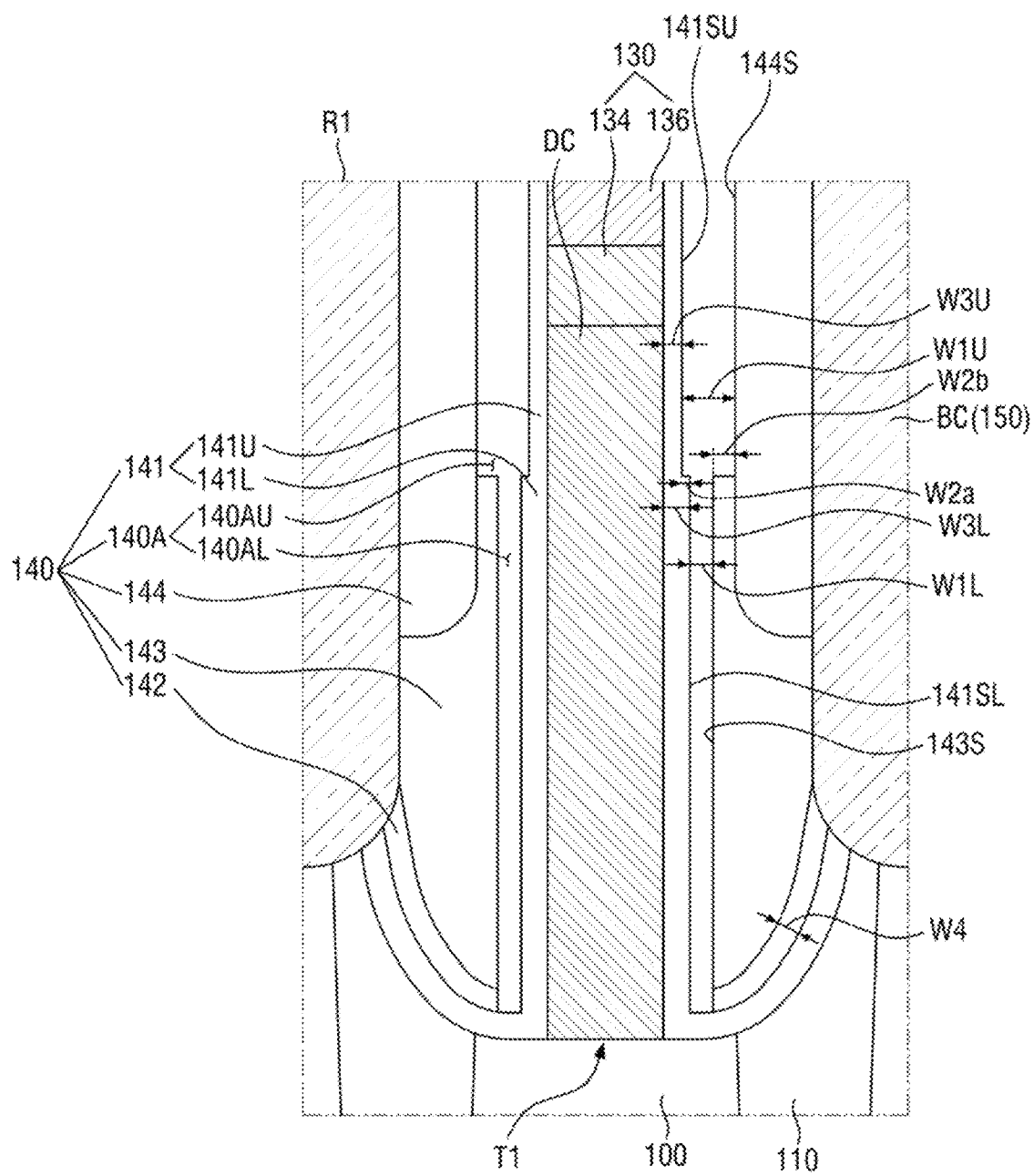
FIGS. 3A, 3B, 3C, 3D and 3E are various enlarged views illustrating the R1 region of FIG. 2 according to exemplary embodiments of the present inventive concept.

FIG. 1 is a plan view of a semiconductor device according to an exemplary embodiment of the present inventive concept. FIG. 2 is a cross sectional view taken along line A-A' of FIG. 1 according to an exemplary embodiment of the present inventive concept FIGS. 3A, 3B, 3C, 3D and 3E are various enlarged views of the R1 region of FIG. 2 according to an exemplary embodiment of the present inventive concept. FIG. 4 is a cross sectional view taken along line B-B' of FIG. 1 according to an exemplary embodiment of the present inventive concept.

Referring to FIGS. 1, 2, 3 and 4, a semiconductor device according to an exemplary embodiment of the present inventive concept includes a substrate 100, a device isolation film 110, a base insulating film 120, a bit line structure 130, a word line structure 160, a spacer structure 140, a direct contact DC, a contact structure 150, an interlayer insulating film 180 and a capacitor structure 190.

The substrate 100 may include a base substrate and an epi-layer stacked one on top of the other, although the present inventive concept is not limited thereto. The substrate 100 may be a silicon substrate, a gallium arsenide substrate, a silicon germanium substrate, or a semiconductor on insulator (SOI) substrate. For example, the substrate 100 as described hereafter may be a silicon substrate.

The substrate 100 may include an active region AR. As design rules of the semiconductor device decrease, the active region AR may be formed to be a diagonal bar shape. For example, as illustrated in FIG. 1, the active region AR may be a bar shape which extends in a direction different (e.g., an oblique direction) from a first direction (e.g., an X direction) and a second direction (e.g., a Y direction) on a plane where the first direction (e.g., the X direction) and the second direction (e.g., the Y direction) extend.

The active region AR may be a plurality of bar shapes extending in horizontal directions to one another. Further, a center of one active region AR among a plurality of active regions AR may be disposed to be adjacent to an ending portion of another active region AR. For example, end portions of adjacent active regions AR may overlap in the first direction (e.g., an X direction) and may be staggered with respect to one another.

The active region AR may function as source and drain regions by including impurities. According to an exemplary embodiment of the present inventive concept, a center of the active region AR may be in contact with the bit line structure 130 by the direct contact DC, and both ends of the active region AR may be in contact with the capacitor structure 190 by the contact structure 150.

The device isolation film 110 may define a plurality of active regions AR. Although it is illustrated in FIGS. 2 and 4 that a side surface of the device isolation film 110 has inclination, the present inventive concept is not limited thereto.

The device isolation film 110 may include silicon oxide, silicon nitride, or a combination thereof, but is not limited thereto. The device isolation film 110 may be a single-layered film formed with one type of an insulating material or a multi-layered film formed with a combination of various types of insulating materials.

The base insulating film 120 may be formed on the substrate 100 and the device isolation film 110. According to an exemplary embodiment of the present inventive concept, the base insulating film 120 may extend along an upper surface of the substrate 100 and an upper surface of the device isolation film 110 in a region where the direct contact DC and a buried contact BC are not formed.

The base insulating film 120 may be a single-layered film, but may also be a multi-layered film, as illustrated. For example, the base insulating film 120 may include a first insulating film 122, a second insulating film 124, and a third insulating film 126 which are stacked sequentially on the substrate 100.

The first insulating film 122 may include silicon oxide, for example. The second insulating film 124 may include a material having a different etch selectivity from an etch selectivity of the first insulating film 122. For example, the second insulating film 124 may include silicon nitride. The third insulating film 126 may include a material having a smaller dielectric constant than a dielectric constant of the second insulating film 124. For example, the third insulating film 126 may include silicon oxide.

The bit line structure 130 may be formed on the substrate 100, the device isolation film 110, and the base insulating film 120. The bit line structure 130 may extend longitudinally across the active region AR and the word line structure 160 along the second direction (e.g., the Y direction). For example, the bit line structure 130 may traverse the active region AR obliquely, and traverse the word line structure 160 orthogonally. A plurality of the bit line structures 130 may be spaced in the first direction (e.g., the X direction). For example, a plurality of the bit line structures 130, which are spaced apart by a same pitch, may be formed.

According to an exemplary embodiment of the present inventive concept, a first conductive pattern may include the bit line structure 130 and the direct contact DC. The bit line structure 130 may include at least two conductive films 132, 134 and 136 and a first capping pattern 138 which are sequentially stacked on the substrate 100.

The conductive films 132, 134, 136 may be single-layered films, but may also be multi-layered films, as illustrated. For example, the conductive films of the bit line structure 130 may include a first conductive film 132, a second conductive film 134 and a third conductive film 136 which are sequentially stacked on the substrate 100.

The first conductive film 132, the second conductive film 134, and the third conductive film 136 may each include, for example, polysilicon, titanium nitride (TiN), titanium silicon nitride (TiSiN), tungsten, tungsten silicide, or a combination thereof, but the present inventive concept is not limited thereto. For example, the first conductive film 132 may include polysilicon, the second conductive film 134 may include TiSiN, and the third conductive film 136 may include tungsten.

The first capping pattern 138 may be formed on the first to third conductive films 132, 134, and 136. For example, the first capping pattern 138 may be formed on the third conductive film 136. The first capping pattern 138 may include silicon nitride, but the present inventive concept is not limited thereto.

The direct contact DC may connect the active region AR of the substrate 100 with the bit line structure 130 by penetrating through the base insulating film 120. For example, the second conductive film 134 and the third conductive film 136 of a respective bit line structure 130 may be disposed on an upper surface of the direct contact DC while the direct contact DC penetrates through the first conductive film 132 with sidewalls of the direct contact DC surrounded thereby in the second direction (e.g., the Y direction). The substrate 100 may include a first trench T1. The first trench T1 may expose at least a portion of the active region AR by penetrating through the base insulating film 120. The direct contact DC may be formed within the first trench T1, and may connect the active region AR of the substrate 100 with the first to third conductive films 132, 134, and 136, For example, the direct contact DC may have a lower surface that is disposed below the lowermost first insulating film 122 and which is exposed to an active region AR. The direct contact DC may extend in a thickness direction orthogonal to a plane of the upper surface of the substrate 100 from the bottom of the first trench T1 to a lower surface of the second conductive film 134.

According to an exemplary embodiment of the present inventive concept, as illustrated in FIG. 1, the first trench T1 may expose a center of the active region AR. Accordingly, the direct contact DC may be in contact with a center of the active region AR. For example, the center of the active regions AR may have a staggered arrangement with respect to one another in a plan view. According to an exemplary embodiment of the present inventive concept, a portion of the first trench T1 may overlap a portion of the device isolation film 110. Accordingly, the first trench T1 may expose a portion of the device isolation film 110 as well as a portion of the substrate 100.

The direct contact DC may include a conductive material. Accordingly, the first to third conductive films 132, 134, and 136 of the bit line structure 130 may be in electrical contact with the active region AR of the substrate 100. The active region AR of the substrate 100 in contact with the first to third conductive films 132, 134, and 136 and the direct contact DC may function as source and drain regions.

According to an exemplary embodiment of, the present inventive concept, the direct contact DC may include a same material as that of the first conductive film 132. For example, the direct contact DC may include polysilicon. However, the present inventive concept is not limited thereto. According to a fabricating process, the direct contact DC may include a different material from a material of the first conductive film 132.

According to an exemplary embodiment of the present inventive concept, a width of the direct contact DC may be less than a width of the first trench T1 in the first direction (e.g., the X direction). For example, as illustrated in FIG. 2, the direct contact DC may overlap only a portion of the substrate 100 which is exposed by the first trench T1. According to an exemplary embodiment of the present inventive concept, a width of the bit line structure 130 may be also less than a width (e.g., a diameter) of the first trench T1. For example, as illustrated in FIG. 2, a width of the bit line structure 130 may be substantially the same as a width of the direct contact DC in the first direction (e.g., the X direction).

The word line structure 160 may traverse the active region AR and the bit line structure 130, and extend latitudinally along the first direction (e.g., the X direction). For example, as illustrated in FIG. 1, the word line structure 160 may traverse the active region AR obliquely, and traverse the bit line structure 130 orthogonally. A plurality of word line structures 160 may be spaced apart from one another in the second direction (e.g., the Y direction). For example, a plurality of word line structures 160 spaced apart by a same pitch may be formed.

According to an exemplary embodiment of the present inventive concept, as illustrated it FIG. 4, the word line structure 160 may include a gate dielectric film 162, second conductive patterns, and a second capping pattern 166.

The second conductive pattern may be a single-layered film, but may also be a multi-layered film, as illustrated. For example, the second conductive pattern may include a fourth conductive film 164 and a fifth conductive film 166 which are sequentially stacked on the substrate 100. The fourth conductive film 164 and the fifth conductive film 166 may respectively include, for example, metal, polysilicon, or a combination thereof, but the present inventive concept is not limited thereto.

The gate dielectric film 162 may be disposed between the second conductive pattern and the substrate 100. The gate dielectric film 162 may include silicon oxide, silicon oxynitride, silicon nitride, and/or a high-k dielectric material having a dielectric constant greater than a dielectric constant of silicon oxide, for example. However, the present inventive concept is not limited thereto.

The second capping pattern 168 may be formed on the second conductive pattern. The second capping pattern 168 may include silicon nitride, but the present inventive concept is not limited thereto.

According to an exemplary embodiment of the present inventive concept, the word line structure 160 may be buried within the substrate 100. For example, the substrate 100 may include a fourth trench T4 extending in the first direction (e.g., the X direction). The gate dielectric film 162 may extend along a profile of the fourth trench T4. The fourth and fifth conductive films 164 and 166 may fill a portion of the fourth trench T4 on the gate dielectric film 162. For example, the fourth conductive film 164 may have a substantially "U" shape in cross-section and may line a lowermost portion of the fourth trench T4, and the fifth conductive film 166 may fill an interior portion of the "U" shaped fifth conductive film 164 and may have an upper surface substantially coplanar therewith. The second capping pattern 168 may fill another portion of the fourth trench T4 on the second conductive pattern. For example, the second capping pattern 168 may have a substantially rectangular shape with a lower surface disposed on the planarized upper surface of the second conductive pattern, an upper surface disposed on the first insulating film 122, and parallel side surfaces disposed on the device insulation film 110 and a lower portion of the direct contact DC.

The spacer structure 140 may be formed on a side surface of the bit line structure 130. Further, the spacer structure 140 may extend along a side surface of the bit line structure 130. As illustrated in FIG. 1, the spacer structure 140 may extend longitudinally along the second direction Y.

According to an exemplary embodiment of the present inventive concept, a portion of the spacer structure 140 may be in contact with the substrate 100 and the device isolation film 110. For example, in a region where the first trench T1 is formed, a lower portion of the spacer structure 140 may fill the first trench T1. However, in a region where the first trench T1 is not formed, the spacer structure 140 may be formed on the base insulating film 120. According to an exemplary embodiment of the present inventive concept, the spacer structure 140 may have a flat lowermost portion connected to parallel curved sides. The flat portion may contain the exposed direct contact DC connected to the substrate 100 and the curve parallel sides may contact respective device insulation films 110 with upper surfaces that contact a lower portion of the contact structures 150.

The spacer structure 140 may include an air spacer 140A. The air spacer 140A may be formed as air or a void. The air spacer 140A may have dielectric constant less than a dielectric constant of silicon oxide, and may efficiently decrease parasitic capacitance of the semiconductor device according to an exemplary embodiment of the present inventive concept.

The air spacer 140A may extend along at least a portion of a side surface of the bit line structure 130. In a region where the first trench T1 is not formed, the air spacer 140A may be formed on the base insulating film 120. In a region where the first trench T1 is formed, the air spacer 140A may extend along a side surface of the bit line structure 130 and a side surface of the direct contact DC. For example, as illustrated in FIG. 3A, the air spacer 140A may include a first portion 140AL and a second portion 140AU. For example, the air spacer 140A may extend in a thickness direction (e.g., the direction orthogonal to the plane of the upper surface of the substrate 100) from a lower portion of the first trench T1, and in the second direction (e.g., the Y direction).

The first portion 140AL of the air spacer 140A may be formed within the first trench T1. For example, the first portion 140AL of the air spacer 140A may extend along a side surface of the direct contact DC. As the first trench T1 may be formed within the substrate 100, a lowermost surface of the air spacer 140A including the first portion 140AL may be formed to be lower than an upper surface of the base insulating film 120. According to an exemplary embodiment of the present inventive concept, the first portion 140AL of the air spacer 140A may not extend along the first trench T1. The second portion 140AU of the air spacer 140A may be formed on the first portion 140AL and may include, for example, a stepped interface. The second portion 140AU of the air spacer 140A may extend along a side surface of the bit line structure 130. The second portion 140AU of the air spacer 140A may be connected with the first portion 140AL of the air spacer 140A. In other words, the second portion 140AU of the air spacer 140A may be integrally formed with the first portion 140AL of the air spacer 140A.

According to an exemplary embodiment of the present inventive concept, as illustrated in FIG. 3A, a width W1U of the second portion 140AU of the air spacer 140A may be greater than a width W1L of the first portion 140AL of the air spacer 140A.

According to an exemplary embodiment of the present inventive concept, a width W1L of the first portion 140AL of the air spacer 140A may be equal to or greater than about 15 Å. When a width W1L of the first portion 140AL of the air spacer 140A is less than 15 Å, a void may be difficult to form within the first portion 140AL of the air spacer 140A in an etching process. For example, a width W1L of the first portion 140AL of the air spacer 140A may be about 15 Å to about 25 Å and a width W1U of the second portion 140AU of the air spacer 140A may be about 26 Å to about 34 Å. Preferably, a width W1L of the first portion 140AL of the air spacer 140A may be about 18 Å to about 22 Å, and a width W1U of the second portion 140AU of the air spacer 140A may be about 28 Å to about 32 Å.

According to an exemplary embodiment of the present inventive concept, the spacer structure 140 may be a multi-layered film formed in a combination of various types of insulating materials. For example, the spacer structure 140 may further include a first spacer 141, a second spacer 142, a third spacer 143, and a fourth spacer 144.

The first spacer 141 may extend along at least a portion of a side surface of the bit line structure 130. The first spacer 141 may represent an innermost layer of the spacer structure 140 nearest to the direct contact DC and the bit line structure 130, and may at least partially surround sidewalls of the direct contact DC and the bit line structure 130 in the thickness direction. For example, the first spacer 141 may cover the curved sidewalls of the first trench T1 and the vertical sidewalls of the direct contact DC and the bit line structure 130. In other words, the first spacer 141 may line a resultant shape of the first trench T1 when tracing around an area occupied by the direct contact DC and the bit line structure 130. In a region where the first trench T1 is not formed, the first spacer 141 may extend along a side surface of the bit line structure 130 and an upper surface of the base insulating film 120. In a region where the first trench T1 is formed, the first spacer 141 may extend along a side surface of the bit line structure 130, a side surf ice of the direct contact DC, and a first trench T1. For example, as illustrated in FIG. 3A, the first spacer 141 may include a lower spacer 141L and an upper spacer 141U.

The lower spacer 141L may be formed within the first trench T1. For example, the lower spacer 141L may extend along a side surface of the direct contact DC and the first trench T1. The upper spacer 141U may be formed on the lower spacer 141L. For example, the upper spacer 141U may extend along a side surface of the bit line structure 130. The upper spacer 141U may be connected with the lower spacer 141L, That is, the upper spacer 141U may be integrally firmed with the lower spacer 141L.

The first spacer 141 may be disposed between the bit line structure 130, the direct contact DC and the air spacer 140A. According to an exemplary embodiment of the present inventive concept, the first spacer 141 may be in contact with the bit line structure 130 and the direct contact DC.

The first spacer 141 may include silicon oxide, silicon oxynitride silicon nitride, or a combination thereof, but the present inventive concept is not limited thereto. The following will be exemplarily described below based on an assumption that the first spacer 141 includes silicon nitride.

The second spacer 142 nary be formed on the first spacer 141 within the first trench T1. For example, the second spacer 142 may extend along the curved sidewalls of the first trench T1 overlapping the lower spacer 141L of the first spacer 141 with opposite respective ends contacting the contact structure 150 and a sidewall of the first portion 140AL of the air spacer 140A. According to an exemplary embodiment of the present inventive concept, the second spacer 142 may not extend vertically along; a side surface of the direct contact DC.

According to an exemplary embodiment of the present inventive concept, the second spacer 142 may define a lower portion of the air spacer 140A. For example, as illustrated in FIG. 3A, the second spacer 142 may define a lower portion of the first portion 140AL of the air spacer 140A.

According to an exemplary embodiment of the present inventive concept, a lowermost surface of the second spacer 142 may be disposed on a same plane as a lowermost surface of the air spacer 140A. For example, a lowermost surface of the second spacer 142 may be disposed on a same plane as a lower surface of the first portion 140AL of the air spacer 140A.

The second spacer 142 may include silicon oxide, silicon oxynitride, silicon nitride, or a combination thereof but the present inventive concept is not limited thereto. According to an exemplary embodiment of the present inventive concept, the second spacer 142 may include a material different from a material of the first spacer 141. For example, the second spacer 142 may include a material having a dielectric constant that is greater than a dielectric constant of the first spacer 141. Alternatively, the second spacer 142 may include a material having a different etch selectivity from an etch selectivity of the tint spacer 141. The following will be exemplarily described below based on an assumption that the second spacer 142 includes sill on oxide. The third spacer 143 may fill a portion of the first trench T1. The third spacer 143 may be spaced apart from the first spacer 141 by the air spacer 140A. For example, as illustrated in FIG. 3A, the first portion 140AL of the air spacer 140A may be disposed between the lower spacer 141L and the third spacer 143. The third spacer 143 may occupy a space defined by the second spacer 142, the first portion 140AL, and the fourth spacer 144.

According to an exemplary embodiment of the present inventive concept, an uppermost surface of the third spacer 143 may be disposed on a same plane as an uppermost surface of the lower spacer 141L and an uppermost surface of the first portion 140AL.

The third spacer 143 may include silicon oxide, silicon oxynitride, silicon nitride, or a combination thereof, but the present inventive concept is not limited thereto. According to an exemplary embodiment of the present inventive concept, the third spacer 143 may include a material different from a material of the second spacer 142. For example, the third spacer 143 may include a material having a different etch selectivity from an etch selectivity of the second spacer 142. The following will be exemplarily described below based on an assumption that the third spacer 143 includes silicon nitride.

The fourth spacer 144 may be formed on the third spacer 143. The fourth spacer 144 may extend along at least a portion of a side surface of the bit line structure 130 and the direct contact DC at a first sidewall. A second sidewall opposite to the first sidewall may be disposed on the contact structure 150. A lower portion of the fourth spacer 144 may be curved and extend below a stepped portion of the air spacer 140A. A gap between the first sidewall of the lowermost portion of the fourth spacer 144 and the first portion 140AL extending from the stepped portion may be occupied by a vertical segment of the third spacer 143. For example, the third spacer 143 may have a shape defined by the lower portion of the fourth spacer 111, the first portion 140AL, and the second spacer 142. Further, the fourth spacer 144 may be spaced apart from the first spacer 141 by the air spacer 140A. For example, as illustrated in FIG. 3A, the second portion 140AU of the air spacer 140A may be disposed between the upper spacer 141U and the fourth spacer 144. According to an exemplary embodiment of the present inventive concept, a lower surface of the fourth spacer 144 may be formed to be lower than an uppermost surface of the third spacer 143. In other words, a lower surface of the fourth spacer 144 may be formed to be lower than a lower surface of the second portion 140AU of the air spacer 140A. For example, a lower portion of the fourth spacer 144 may have a form buried within the third spacer 143.

According to an exemplary embodiment of the present inventive concept, the fourth spacer 144 may extend along at least a portion of a side surface of the contact structure 150. For example, the fourth spacer 144 may be disposed between the air spacer 140A and the contact structure 150. According to an exemplary embodiment of the present inventive concept, the fourth spacer 144 may be in contact with the contact structure 150.

The fourth spacer 144 may include silicon oxide, silicon oxynitride, silicon nitride, or a combination thereof, but the present inventive concept is not limited thereto. According to an exemplary embodiment of the present inventive concept, the fourth spacer 144 may include a material different from a material of the second spacer 142. For example, the fourth spacer 144 may include a material having a different etch selectivity from an etch selectivity of to the second spacer 142. The following will be exemplarily described below based on an assumption that the fourth spacer 144 includes silicon nitride.

According to an exemplary embodiment of the present inventive concept, the first spacer 141, the third spacer 143 and the fourth spacer 144 may define the air spacer 140A. For example, the first spacer 141 and the third spacer 143 may define the first portion 140AL of the air spacer 140A, and the first spacer 141 and the fourth spacer 144 may define the second portion 140AU of the air spacer 140A.

For example, as illustrated in FIG. 3A, the lower spacer 141L may include a first side surface 141SL opposite to the third spacer 143, and the upper spacer 141U may include a second side surface 141SU opposite to the fourth spacer 144. Further, the third spacer 143 may include a third side surface 143S opposite to the lower spacer 141L, and the fourth spacer 144 may include a fourth side surface 144S opposite to the upper spacer 141U. The first side surface 141SL may define one side of the first portion 140AL of the air spacer 140A, and the third side surface 143S may define another side of the first portion 140AL of the air spacer 140A. Further, the second side surface 141SU may define one side of the second portion 140AU of the air spacer 140A, and the fourth side surface 144S may define another side of the second portion 140AU of the air spacer 140A.

According to an exemplary embodiment of the present inventive concept, a width W3U of the upper spacer 141U may be less than a width W3L of the lower spacer 141L. For example, the second side surface 141SU may be placed nearer to a side surface of the first conductive pattern than the first side surface 141SL.

According to an exemplary embodiment of the present inventive concept, a width W3U of the upper spacer 141U may be equal to or less than about 20 Å. When a width W3U of the upper spacer 141U is above 20 Å, it may be difficult to secure space to form a spacer thereafter due to shortage of fabrication margin (e.g., the air spacer 140A or the fourth spacer 144). For example, a width W3U of the upper spacer 141U may be about 10 Å to about 20 Å, and a width W3L of the lower spacer 141L may be about 20.5 Å to about 27.5 Å. Preferably, a width W3U of the upper spacer 141U may be about 13 Å to about 17 Å, and a width W3L of the lower spacer 141L may be about 22 Å to 26 Å.

According to an exemplary embodiment of the present inventive concept, a cross section of the air spacer 140A may have a T-character shape. For example, the first side surface 141SL may be spaced apart from a side surface of the first conductive pattern by a distance in the first direction (e.g., the X direction) that is greater than the second side surface 141SU, and the third side surface 143S may be spaced apart from a side surface of the first conductive pattern by a smaller distance in the first direction (e.g., the X direction) than the fourth side surface 144S. Accordingly, in a cross section intersecting the second direction (e.g., the Y direction), the air spacer 140A may have a T-character shape.

According to an exemplary embodiment of the present inventive concept, a distance W2a of displacement from the first side surface 141SL to the second side surface 141SU in the first direction (e.g., the X direction) may be different from a distance W2b of displacement from the third side surface 143S to the fourth side surface 144S in the first direction (e.g., the X direction). For example, as illustrated in FIG. 3A, a distance W2a of displacement from the first side surface 141SL to the second side surface 141SU may be less than a distance W2b of displacement from the third side surface 143S to the fourth side surface 144S.

According to an exemplary embodiment of the present inventive concept, a width W4 of the second spacer 142 may be substantially the same as a width W1L of the first portion 140AL of the air spacer 140A. For example, the width W4 may represent a height in a direction perpendicular to the normal of the curved side surface of the first trench T1. For example, the width W4 of the second spacer 142 and the width W1L of the first portion 140AL of the air spacer 140A may be about 18 Å to about 22 Å.

According to an exemplary embodiment of the present inventive concept, the first portion 140AL of the air spacer 140A may extend in the thickness direction by the width W4 through the second spacer 142 onto an underlying upper surface of the lower spacer 141L of the first spacer 141.

Returning to FIGS. 1 and 2 again, the contact structure 150 may be firmed on the substrate 100 and the device isolation film 110. The contact structure 150 may penetrate through the base insulating film 120, and connect the active region AR of the substrate 100 and the capacitor structure 190. The contact structure 150 may be formed on a side surface of the bit line structure 130. The contact structure 150 may be spaced apart from the bit line structure 130 by the spacer structure 140. In other words, the spacer structure 140 may electrically insulate the bit line structure 130 from the contact structure 150.

According to an exemplary embodiment of the present inventive concept, the contact structure 150 may include a buried contact BC and a landing pad LP which are sequentially stacked on the substrate 100.

The buried contact BC may be formed on the substrate 100 between a plurality of bit line structures 130. According to an exemplary embodiment of the present inventive concept, an upper surface of the buried contact BC may be lower than an upper surface of the bit line structure 130. For example, the upper surface of the buried contact BC may be spaced further from the upper surface of the substrate 100 in the thickness direction than an upper surface of the third conductive film 136, but may be lower than an upper surface of the first capping pattern 138. As illustrated in FIG. 1, the buried contact BC may be disposed on a region which is defined by the word line structure 160 and between adjacent bit line structures 130. Further, the buried contact BC may form a plurality of isolating regions which are spaced apart from one another.

The buried contact BC may penetrate through the base insulating film 120 and connect the active region AR of the substrate 100 and the lauding pad LP. For example, the substrate 100 may include the second trench T2 within the active region AR. The second trench T2 may expose a portion of the active region AR by penetrating the base insulating film 120. The buried contact BC may be formed within the second trench T2 and may connect the active region AR of the substrate 100 and the landing pad LP.

According to an exemplary embodiment of the present inventive concept, the second trench T2 may expose both ends of the active region AR. Accordingly, as illustrated in FIG. 1, the buried contact BC may be in contact with both ends of the active region AR. A portion of the second trench T2 may overlap a portion of the device isolation film 110. Therefore, the second trench T2 may expose a portion of the device isolation film 110 as well as a portion of the substrate 100.

The buried contact BC may include a conductive material. Therefore, the buried contact BC may be in electrical contact with the active region AR of the substrate 100. The active region AR of the substrate 100 in contact with the buried contact BC may function as source and drain regions. For example, the buried contact BC may include polysilicon, but the present inventive concept is not limited thereto.

The landing pad LP may be formed on the buried contact C. Further, the landing pad LP may be in contact with an upper surface of the buried contact BC. According to an exemplary embodiment of the present inventive concept, an upper surface of the landing pad LP may be higher than an upper surface of the bit line structure 130. For example, the landing pad LP may cover a portion of an upper surface of the bit line structure 130.

The landing pad LP may form a plurality of isolating regions which are spaced apart from one another. FIG. 1 illustrates that each of the landing pads LP has a circle shape (e.g., a rectangular shape with rounded edges); however, the present inventive concept is not limited thereto. Further, FIG. 1 illustrates that a plurality of landing pads LP are arranged in honeycomb structure; however, the present inventive concept is not limited thereto.

A plurality of landing pads LP may be in contact with the buried contact BC forming a plurality of isolating regions. For example, each of landing pads LP may be isolated by a third trench T3.

The landing pad LP may include a conductive material. Accordingly, the capacitor structure 190 may be in electrical contact with the active region AR of the substrate 100 through the contact structure 150. The landing pad LP may include tungsten, for example, but not limited thereto.

According to an exemplary embodiment of the present inventive concept, a portion of the third trench T3 may expose a portion of the bit line structure 130. For example, the third trench T3 may be disposed between adjacent landing pads LP and may extend from an upper surface of the landing pad LP in the thickness direction below an upper surface of the bit line structure 130. Accordingly, a plurality of landing pads LP may be isolated from one another by the bit line structure 130 and the third trench. T3. According to an exemplary embodiment of the present inventive concept, a lower surface of the third trench T3 may be formed to be higher than a lower surface of the first capping pattern 138. Accordingly, the third trench T3 may expose a portion of the first capping pattern 138. For example, the third trench T3 may expose an upper corner portion and sidewall of the first capping pattern 138.

As the air spacer 140A may be disposed between the bit fine structure 130 and the contact structure 150, the third trench T3 may expose at least a portion of an upper surface of the air spacer 140A, For example, a portion of the third trench T3 may define an upper surface of the air spacer 140A. According to an exemplary embodiment of the present inventive concept, the third trench T3 may also expose an upper surface of the first spacer 141 and an upper surface of the fourth spacer 144.

The interlayer insulating film 180 may be formed on a portion of an upper surface of the landing pad LP and a portion of the bit line structure 130. Further, the interlayer insulating film 180 may define a region of the landing pad LP forming a plurality of isolating regions. For example, the interlayer insulating film 180 may fill the third trench T3. Accordingly, the interlayer insulating film 180 may isolate a plurality of landing, pads LP from one another in the first direction (e.g., the X direction). Further, the interlayer insulating film 180 may be patterned so as to expose a portion of an upper surface of each of the landing pads LP.

The interlayer insulating film 180 may include an insulating material to electrically isolate a plurality of landing pads LP from one another. For example, the interlayer insulating film 180 may include silicon oxide, silicon oxynitride, silicon nitride, and/or a low-k dielectric material having dielectric constant less than a dielectric constant of silicon oxide, but the present inventive concept is not limited thereto.

The capacitor structure 190 may be disposed on the interlayer insulating film 180 and the landing pad LP. The capacitor structure 190 may be in contact with a portion of an upper surface of the landing pad LP exposed by the interlayer insulating film 180. As a result, the capacitor structure 190 may be in electrical contact with the source and drain regions in contact with the contact structure 150. Accordingly, the capacitor structure 190 may store charges in a semiconductor memory device or the like.

For example, as illustrated in FIGS. 2 and 4, the capacitor structure 190 may include a lower electrode 192, a capacitor dielectric film 194 and an upper electrode 196. The capacitor structure 190 may store charges within the capacitor dielectric film 194 by using a potential difference generated between the lower electrode 192 and the upper electrode 196. The lower electrode 192 may have a tuning fork shape in cross-section. For example, upturned sides of the lower electrode 192 may have lower edge surfaces at least partially disposed on upper surfaces of adjacent interlayer insulating films 180. A lower segment of the lower electrode 192 connected between the upturned sides may extend in the thickness direction onto the upper surface of a corresponding landing pad LP. The capacitor dielectric film 194 may cover exposed surfaces of the lower electrode 192 and the interlayer insulating films 180. The upper electrode 196 may have a shape complimentary to a collective shape of the lower electrode 192 and the capacitor dielectric film 194.

The lower electrode 192 and the upper electrode 196 may include, for example, doped polysilicon, metal and/or metal nitride, but the present inventive concept is not limited thereto. Further, the capacitor dielectric film 194 may include, for example, silicon oxide and/or a high-k dielectric material, but the present inventive concept is not limited thereto.

As the semiconductor device becomes more integrated, influence of parasitic capacitance and leakage current gradually increases. For example, as a pitch between conductive patterns of a dynamic random access memory (DRAM) become narrower, parasitic capacitance between the conductive patterns may increase.

However, the semiconductor device according to an exemplary embodiment of the present inventive concept may reduce parasitic capacitance of the semiconductor device more efficiently by using the air spacer 140A, thus a semiconductor device with an enhanced operating characteristic may be provided.

For example, in the semiconductor device according to an exemplary embodiment of the present inventive concept, the air spacer 140A may include the first portion 140AL formed within the first trench T1. As the first portion 140AL of the air spacer 140A may extend to a lower portion of the conductive pattern (e.g., the direct contact DC and/or the second and third conductive film and the fourth conductive film 134 and 136) formed within the first trench T1, parasitic capacitance between the conductive patterns may be reduced efficiently. For example, the air spacer 140A may efficiently reduce parasitic capacitance between the direct contact DC and the buried contact BC.

Further, in the semiconductor device according to an exemplary embodiment of the present inventive concept, the first spacer 141 defining an inner sidewall of the air spacer 140A adjacent to the direct contact DC may include the upper spacer 141U with the width W3U less than the width W3L of the lower spacer 141L. In other words, the upper spacer 141U may provide additional space so as to form the second portion 140AU of the air spacer 140A. Accordingly, the upper spacer 141U may define the adjacent sidewall of the second portion 140AU of the air spacer 140A, and the second portion 140AU may thus have a greater width and a sidewall protruding further towards the direct contact DC in the first direction (e.g., the X direction) than a corresponding sidewall of the first portion 140AL.

Further, in the semiconductor device according to an exemplary embodiment of the present inventive concept, the air spacer 140A may have a T-character shape. The air spacer 140A having a T-character shape may be easy to form. For example, in an etching process of forming the air spacer 140A, as the second portion 140AU may have a gap-broadening shape from both sides of the first portion 140AL, it is easy to form a void within the first portion 140AL. Therefore, as the air spacer 140A may extend towards the lower portion of the conductive pattern (e.g., direct contact DC) formed within the first trench T1, parasitic capacitance between the conductive patterns may be reduced efficiently.

Figure 3B:
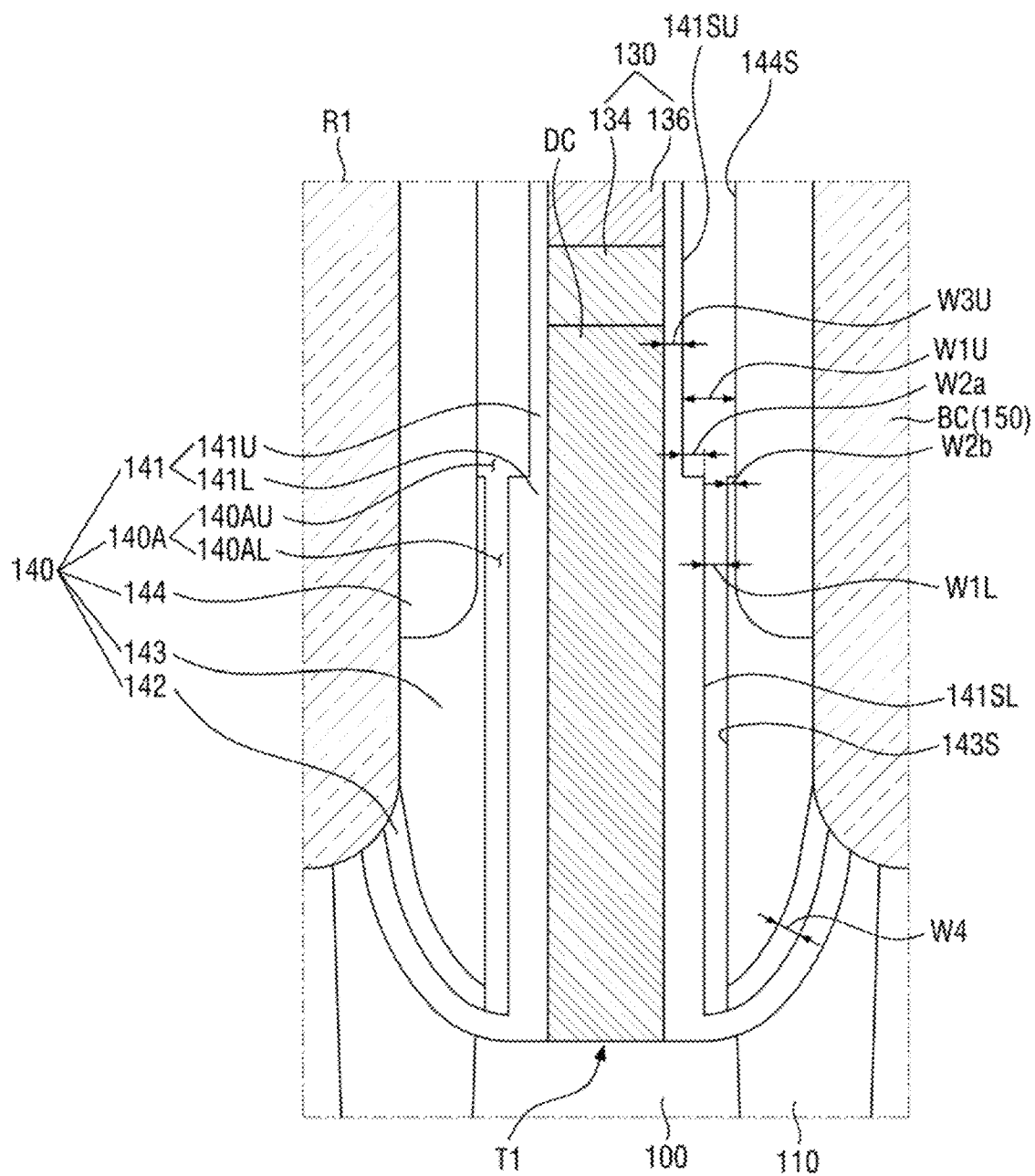
Figure 4:
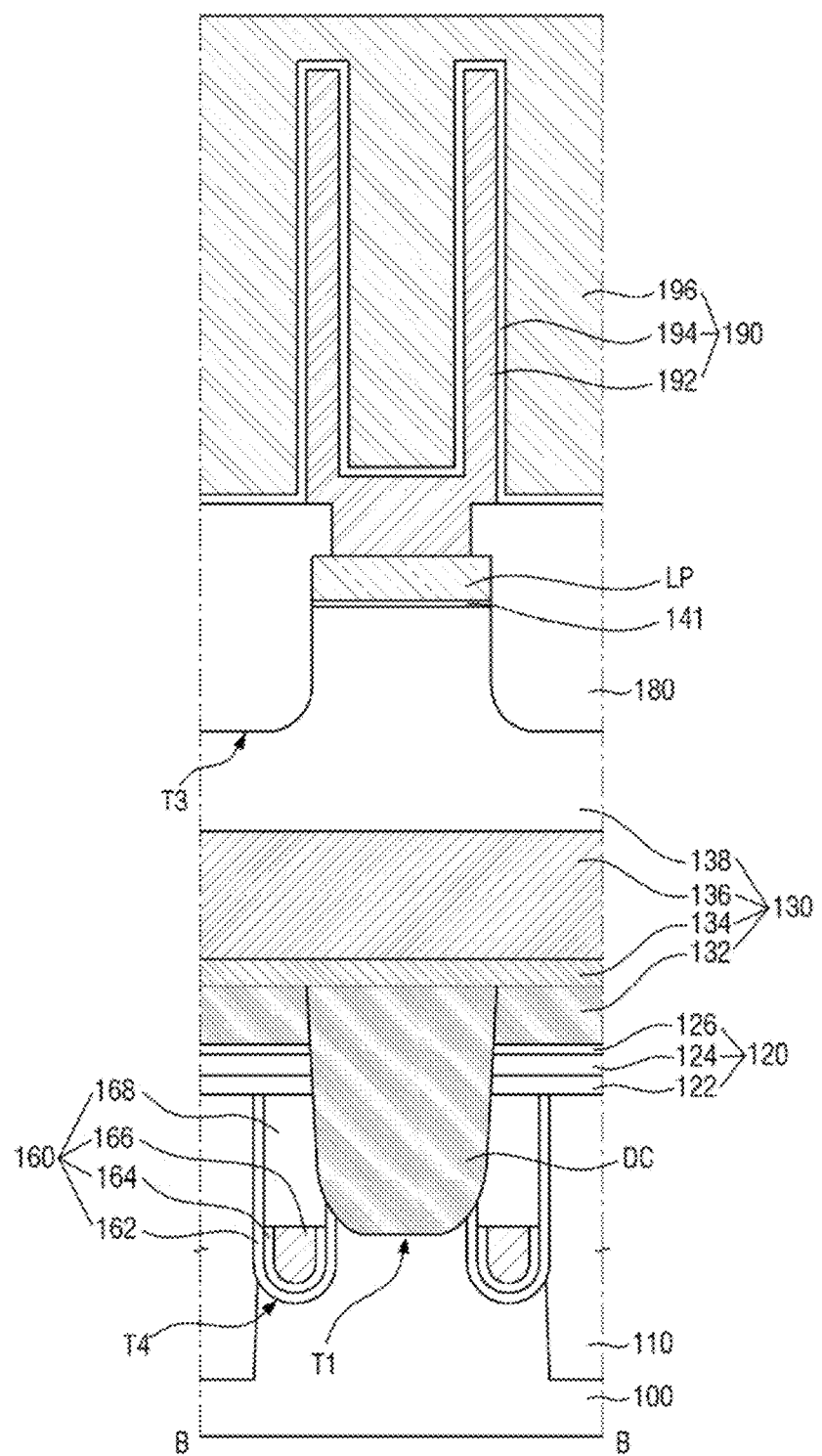
FIG. 4 is a cross sectional view taken along line B-B' of FIG. 1 according to an exemplary embodiment of the present inventive concept.

Referring to FIG. 3B, in the semiconductor device according to an exemplary embodiment of the present inventive concept, a distance W2a of displacement from the first side surface 141SL to the second side surface 141SU may be greater than a distance W2b of displacement from the third side surface 143S to the fourth side surface 144S in the first direction (e.g., the X direction).

Figure 3C:
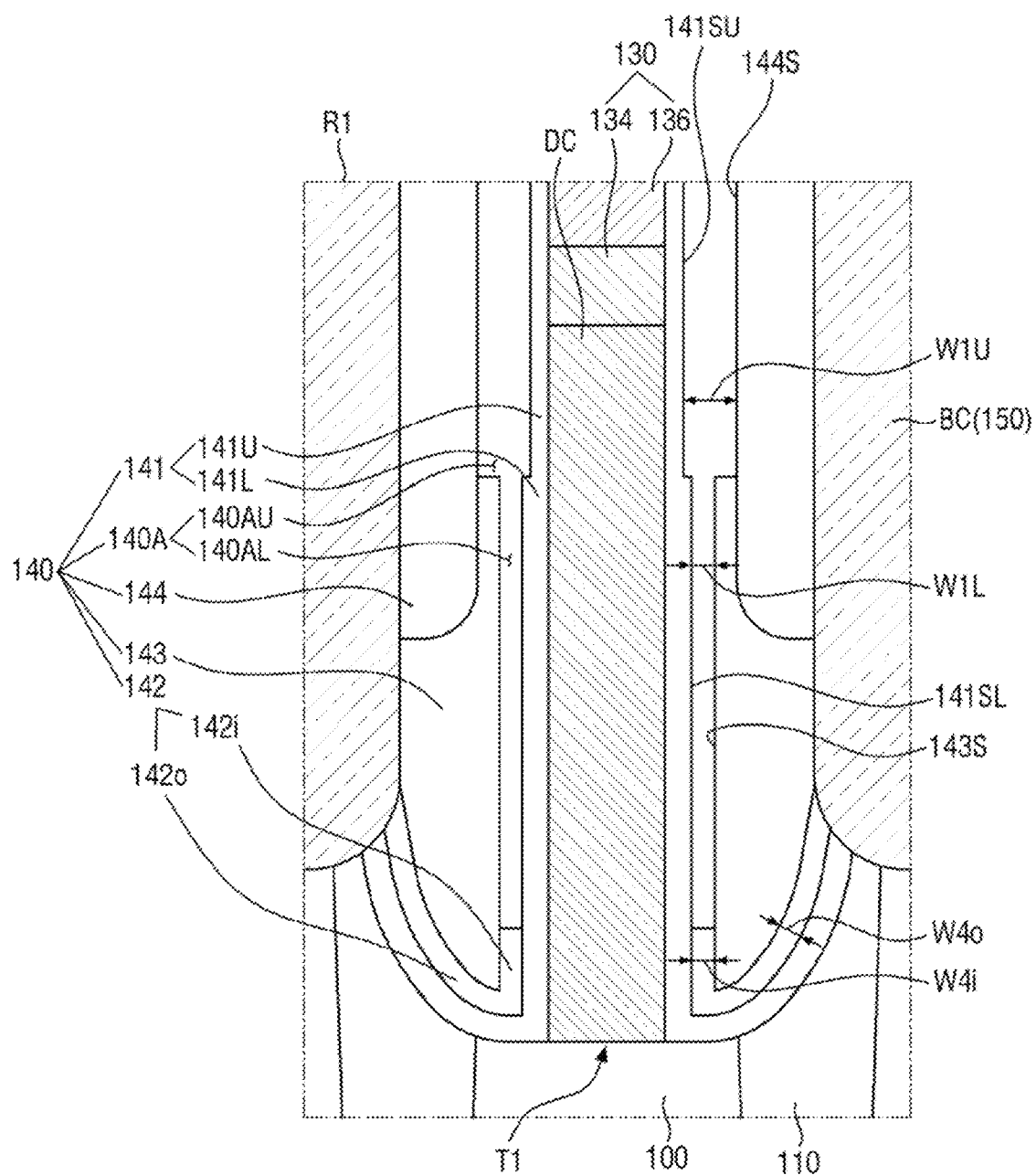

Referring to FIG. 3C, in the semiconductor device according to an exemplary embodiment of the present inventive concept, the second spacer 142 may extend along a portion of a side surface of the direct contact DC and the curved sidewalls of the first trench T1. For example, the second spacer 142 may include an inner side portion 142i and an outer side portion 142o.

The inner side portion 142i of the second spacer 142 may extend along a portion of a side surface of the direct contact DC on, the first spacer 141 in the thickness direction. The outer side portion 142o of the second spacer 142 may be connected to the inner side portion 142i (e.g., integrally formed) and may extend along the curved sidewall of the first trench T1 on the first spacer 141.

According to an exemplary embodiment of the present inventive concept, the second spacer 142 may define a lower portion of the air spacer 140A. For example, as illustrated in FIG. 3C, an upper surface of the inner side portion 142i of the second spacer 142 may define a lower surface of the first portion 140AL of the air spacer 140A. Further, as described above, a lowermost surface of the second spacer 142 (e.g., a lower surface of the inner side portion 142i) may be formed to be lower than a lowermost surface of the air spacer 140A.

According to an exemplary embodiment of the present inventive concept, a width W4i of the inner side portion 142i of the second spacer 142 may be same as a width W1L of the first portion 140AL of the air spacer 140A. According to an exemplary embodiment of the present inventive concept, a width W4o of the outer side portion 142o of the second spacer 142 may be a same width as the width W4i of the inner side portion 142i of the second spacer 142. For example, the width W4i of the inner side portion 142i of the second spacer 142, a width W4o of the outer side portion 142o of the second spacer 142 and the width W1L of the first portion 140AL of the air spacer 140A may be about 18 Å to about 22 Å.

Figure 3D:
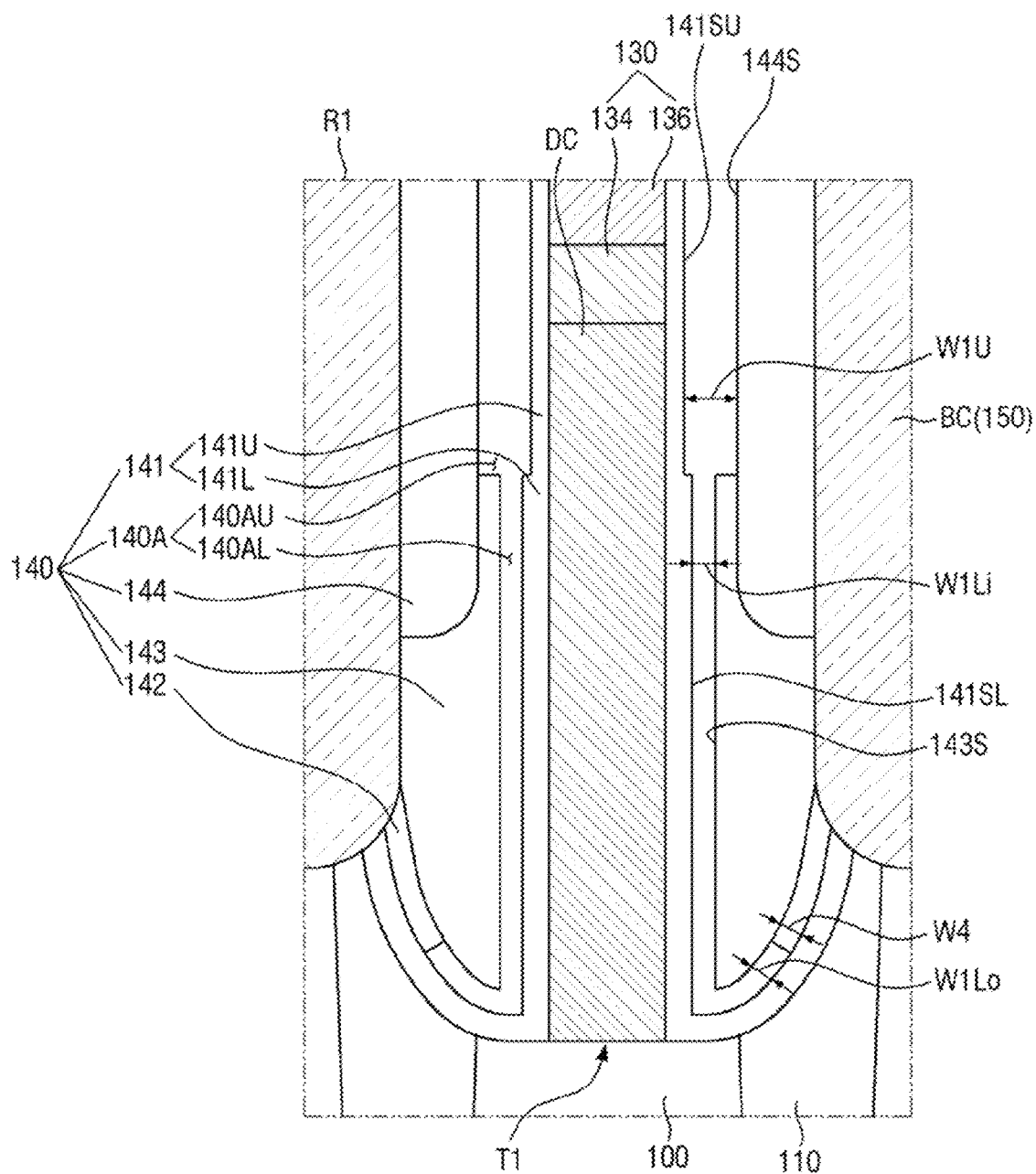

Referring to FIG. 3D, in the semiconductor device according to an exemplary embodiment of the present inventive concept, the air spacer 140A may further extend along a portion of the first trench T1. For example, the first portion 140AL of the air spacer 140A may further extend along a portion of the curved sidewalls of the first trench T1 on the first spacer 141 and may be connected to a first end of the second spacer 142. The second end of the second spacer 142 opposite to the first end may be disposed on the buried contact BC.

According to an exemplary embodiment of the present inventive concept, the second spacer 142 may define a lower portion of the air spacer 140A. For example, as illustrated in FIG. 3D, a lower surface of the second spacer 142 may define an upper surface of the air spacer 140A extending, along the first trench T1. Accordingly, a lowermost surface of the second spacer 142 may be higher than a lowermost surface of the air spacer 140A.

According to an exemplary embodiment of the present inventive concept, a width W1Lo of the air spacer 140A extending along the first trench T1 may be a same width as a width W1Li of the air spacer 140A extending along a side surface of the direct, contact DC. According to an exemplary embodiment of the present inventive concept, a width W1Lo of the air spacer 140A extending along the first trench T1 may be a same width as a width W4 of the second spacer 142. For example, the width W1Lo of the air spacer 140A extending along the first trench T1, the width W1Li of the air spacer 140A extending along a side surface of the direct contact DC, and the width W4 of the second spacer 142 may be about 18 Å to about 22 Å.

Figure 3E:
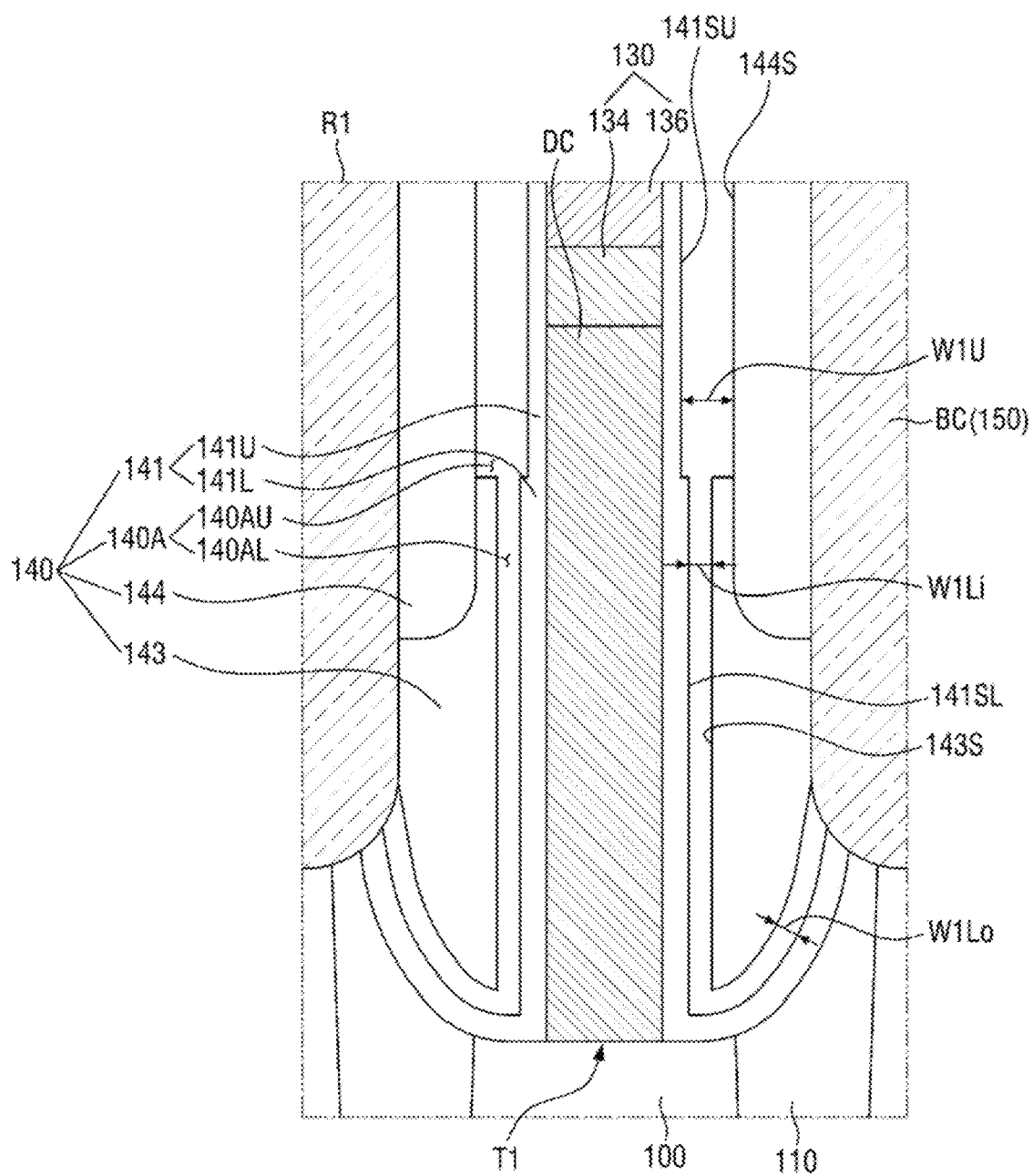

Referring to FIG. 3E, in the semiconductor device according to an exemplary embodiment of the present inventive concept, the air spacer 140A may further extend along the first trench T1. For example, the first portion 140AL of the air spacer 140A may extend along the first trench T1 on the first spacer 141 across an entire curved sidewall.

According to an exemplary embodiment of the present inventive concept, the first portion 140AL of the air spacer 140A may expose a portion of the buried contact BC. For example, in an etching process of forming the air spacer 140A, the second spacer 142 in FIG. 3A may be completely removed.

Figure 5:
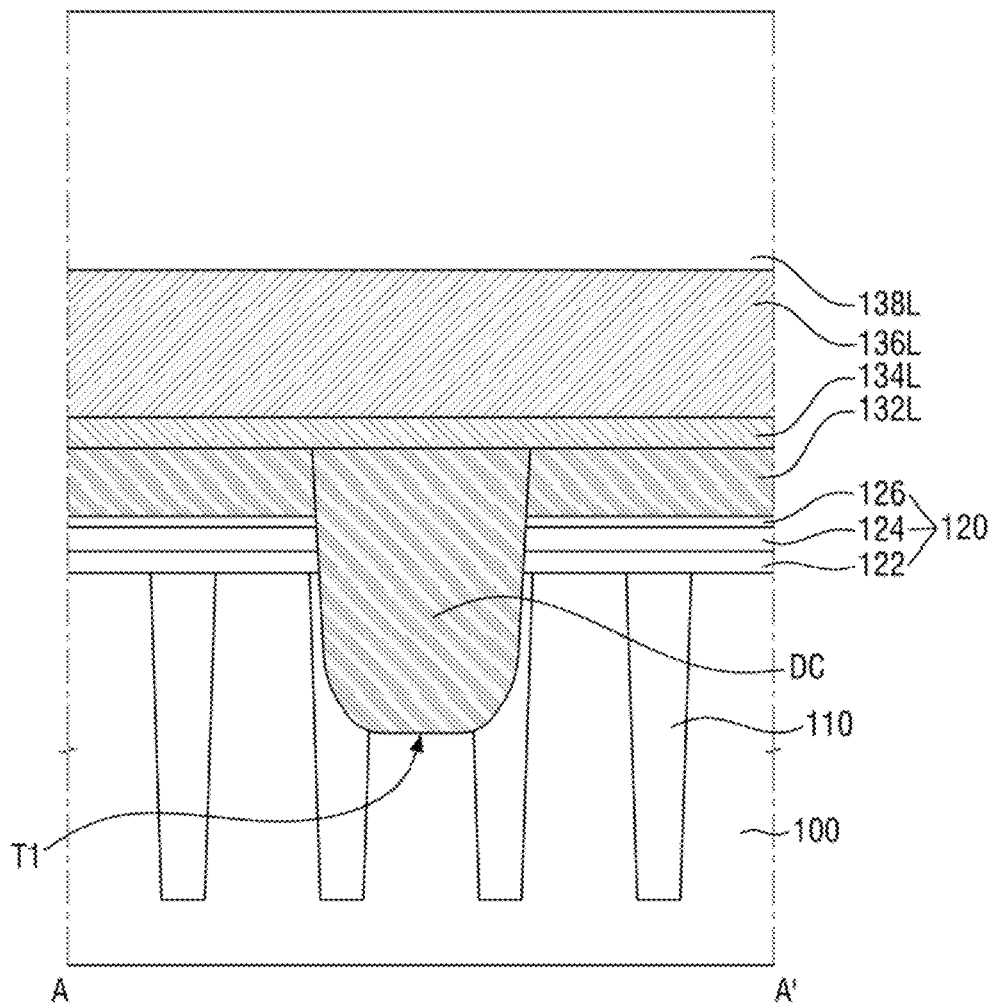
FIGS. 5, 6, 7, 8, 9, 10, 11, 12, 13, 14, 15, 16, 17, 18, 19 and 20 are cross-sectional views illustrating stages of a method for fabricating a semiconductor device according to an exemplary embodiment of the present inventive concept.

FIGS. 5, 6, 7, 8, 9, 10, 11, 12, 13, 14, 15, 16, 17, 18, 19 and 20 are cross-sectional views taken along line A-A' of FIG. 1 illustrating intermediate stages in a method for fabricating a semiconductor device according to an exemplary embodiment of the present inventive concept. For convenience of explanation, previously described elements and relationships may be omitted hereafter for brevity of description. Referring to FIG. 5, a base insulating film 120, first to third conductive films 132, 134, 136, a direct contact DC, and a first capping pattern 138 may be formed on a substrate 100 and a device isolation film 110.

For example, first to third insulating films 122, 124, 126 and the first conductive film 132 may be sequentially formed on the substrate 100 and the device isolation film 110. Subsequently, a first trench T1, which exposes a portion of the active region AR of FIG. 1, may be formed within the substrate 100. According to an exemplary embodiment of the present inventive concept, the first trench T1 may expose a center of the active region AR. Next, the direct contact DC, which fills the first trench T1, may be formed. Subsequently, the second and third conductive films 134 and 136 and the first capping pattern 138 may be sequentially formed on the first conductive film 132 and the direct contact DC.

Referring to FIG. 5, the first to third conductive films 132, 134 and 135, the direct contact DC, and the first capping pattern 138 may be patterned.

Accordingly, a bit line structure 130, which extends longitudinally along the second direction (e.g., the Y direction) while traversing, an active region AR and a word line structure 160, as illustrated in FIG. 1, may be formed. According to an exemplary embodiment of the present inventive concept, a width of the bit line structure 130 and a width of the direct contact DC stacked thereon may be formed to be smaller than a width of the first trench T1. In other words, the patterned bit line structure 130 and the patterned direct contact DC, stacked thereon may not completely fill the first trench T1. An upper surface of the first conductive pattern and upper surfaces of the adjacent bit line structures 130 that do not contain the direct contact DC may be coplanar.

Figure 6:
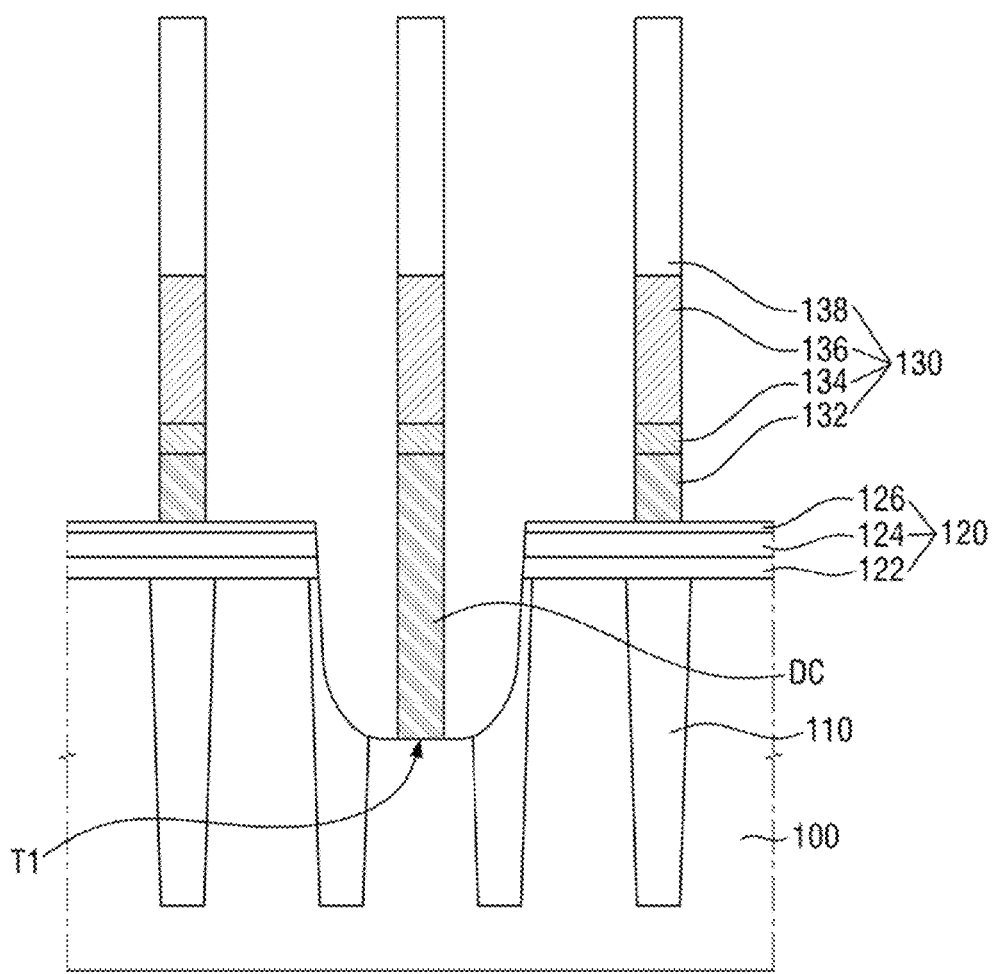
Figure 7:
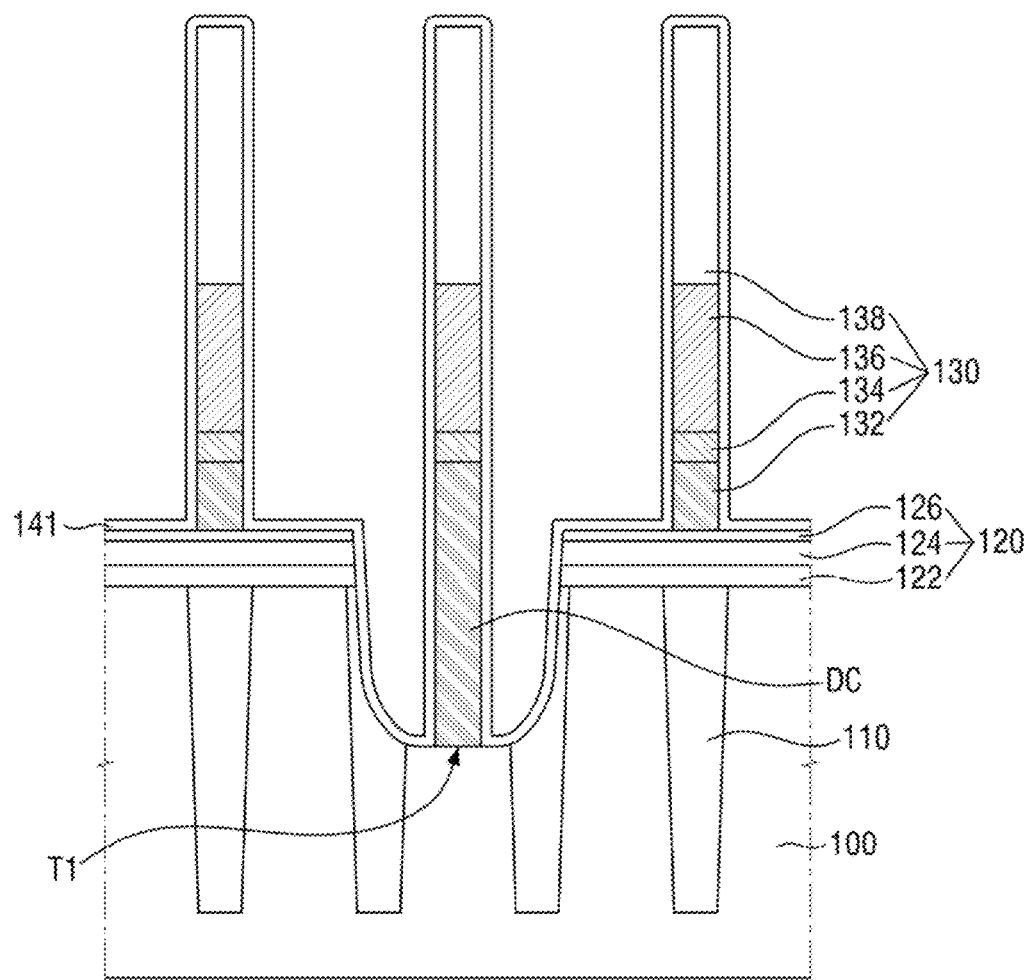

Referring to FIG. 7, the first spacer 141 may be formed on a resultant object of FIG. 6. For example, the first spacer 141 may be disposed on exposed surfaces of the first trench T1, the pattered bit line structures 130, and the patterned direct contact DC.

According to an exemplary embodiment of the present inventive concept, the first spacer 141 may be formed conformally. For example, the first spacer 141 may extend along a side surface and an upper surface of the bit line structure 130, a side surface of the direct contact DC, a side surface and an upper surface of the base insulating film 120, and a profile of the first trench T1.

The first spacer 141 may include silicon oxide, silicon oxynitride, silicon nitride, or a combination thereof, but the present inventive concept is not limited thereto. The following will be exemplarily described below based on an assumption that, the first spacer 141 includes silicon nitride.

Figure 8:
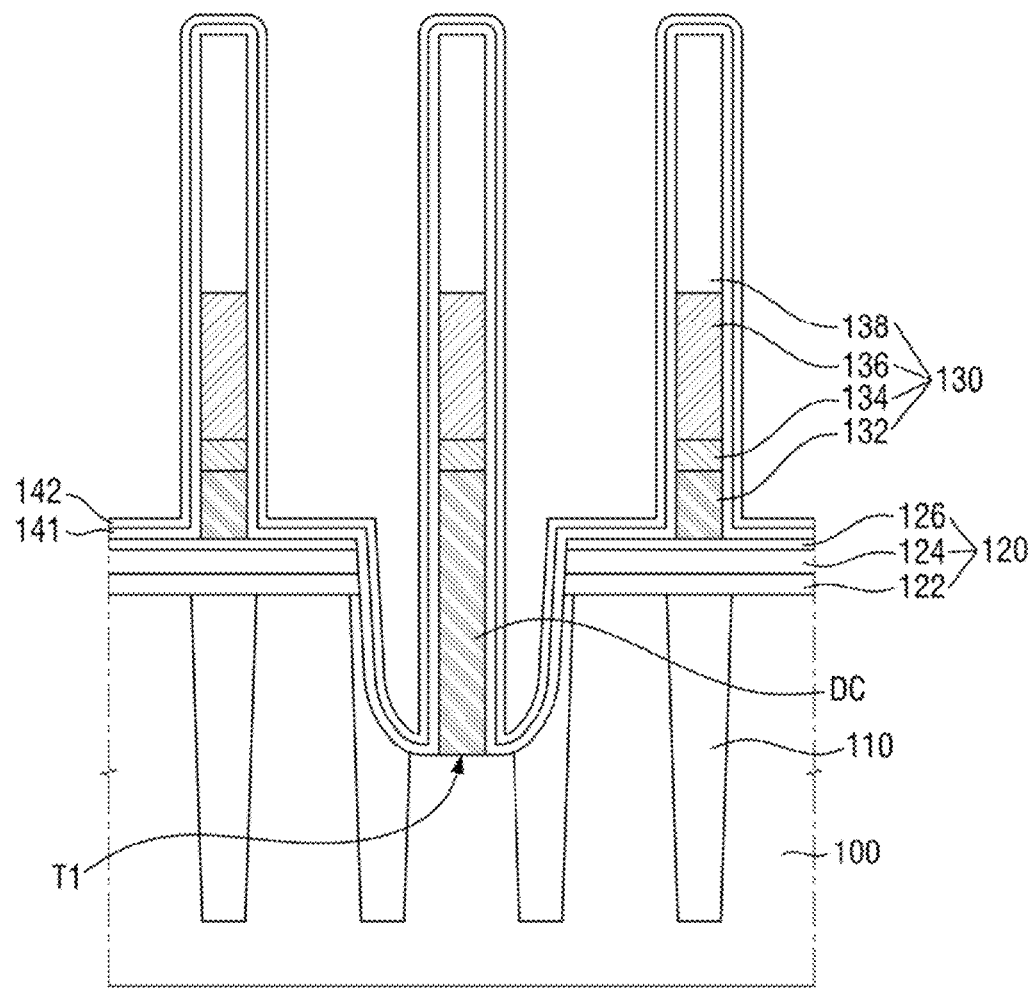

Referring to FIG. 8, the second spacer 142 may be formed on the first spacer 141.

According to an exemplary embodiment of the present inventive concept, the second spacer 142 may be formed conformally on the first spacer 141. For example, the second spacer 142 may extend along a profile of the first spacer 141.

According to an exemplary embodiment of the present inventive concept, the second spacer 142 may include a material different from a material of the first spacer 141. For example, the second spacer 142 may include a material having a dielectric constant greater than a dielectric constant of the first spacer 141. Alternatively, for example, the second spacer 142 may include a material having an etch selectivity different with respect to an etch selectivity of the first spacer 141. The following will be exemplarily described below based on an assumption that the second spacer 142 includes silicon oxide.

Figure 9:
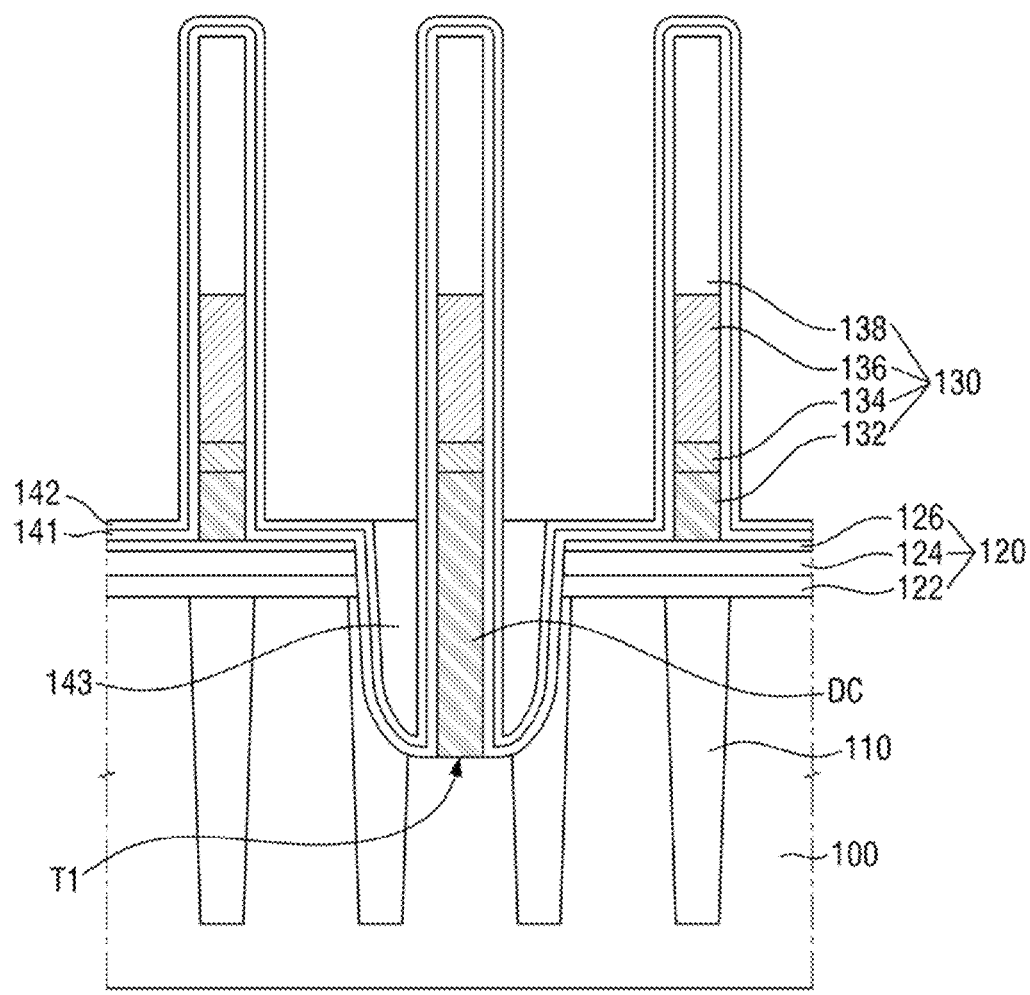

Referring to FIG. 9, a third spacer 143 may be formed within the first trench T1. The third spacer 143 may be formed within the first trench T1 on the second spacer 142. The third spacer 143 may fill a region of the first trench T1 remaining after the first spacer 141 and the second spacer 142 are deposited. For example, an upper surface of the third spacer 143 may be coplanar with an upper surface of the second spacer 142.

For example, a spacer film may be formed on the second spacer 142. Subsequently, a portion of the spacer film may be removed by using the second spacer 142 as an etch prevention film. Accordingly, the third spacer 143 may be formed to fill the first trench T1. Removing a portion of the spacer film may be performed by using, for example, a wet etching process using $H_3PO_4$, but the present inventive concept is not limited thereto.

According to an exemplary embodiment of the present inventive concept, the third spacer 143 may include a material different from a material of the second spacer 142. For example, the third spacer 143 may include a material having a different etch selectivity with respect to an etch selectivity of the second spacer 142. The following will be exemplarily described below based on an assumption that the third spacer 143 includes silicon nitride.

Figure 10:
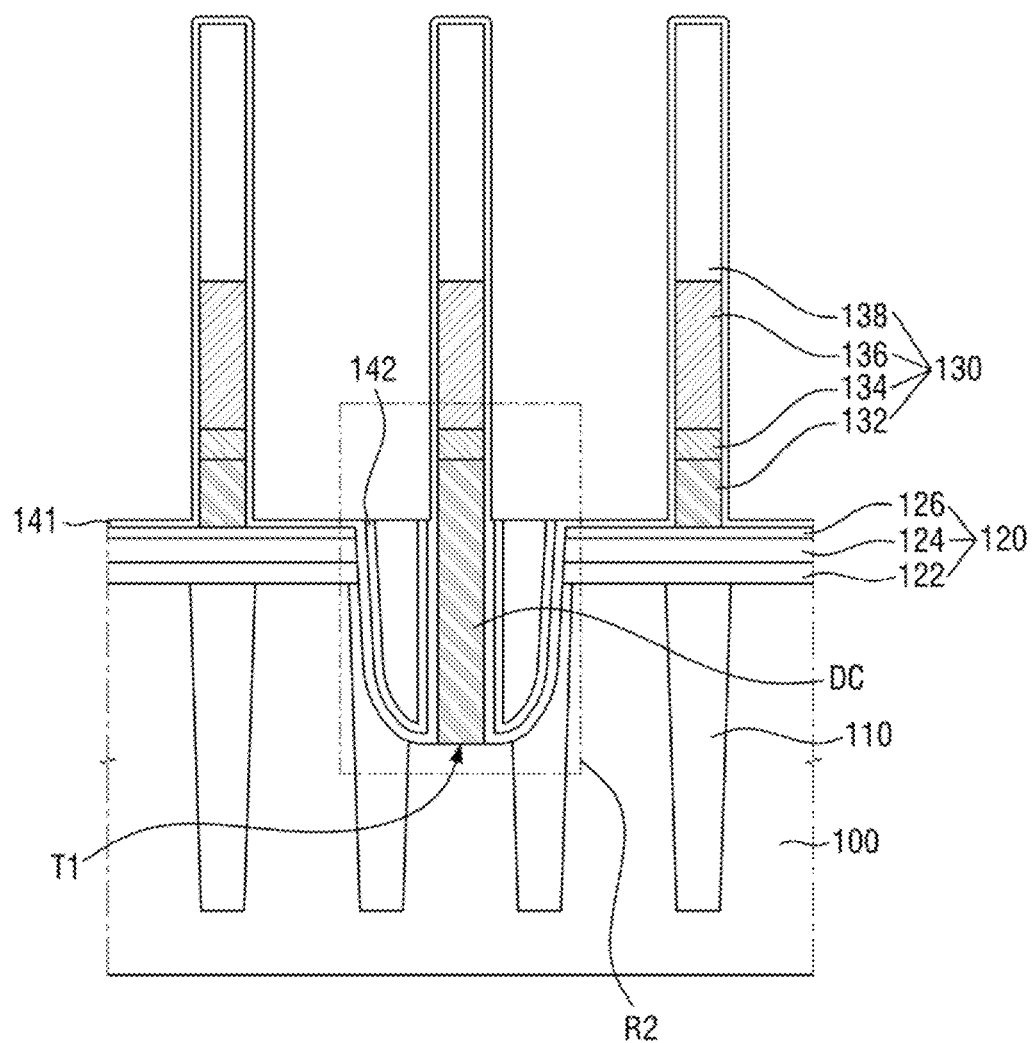
Figure 11:
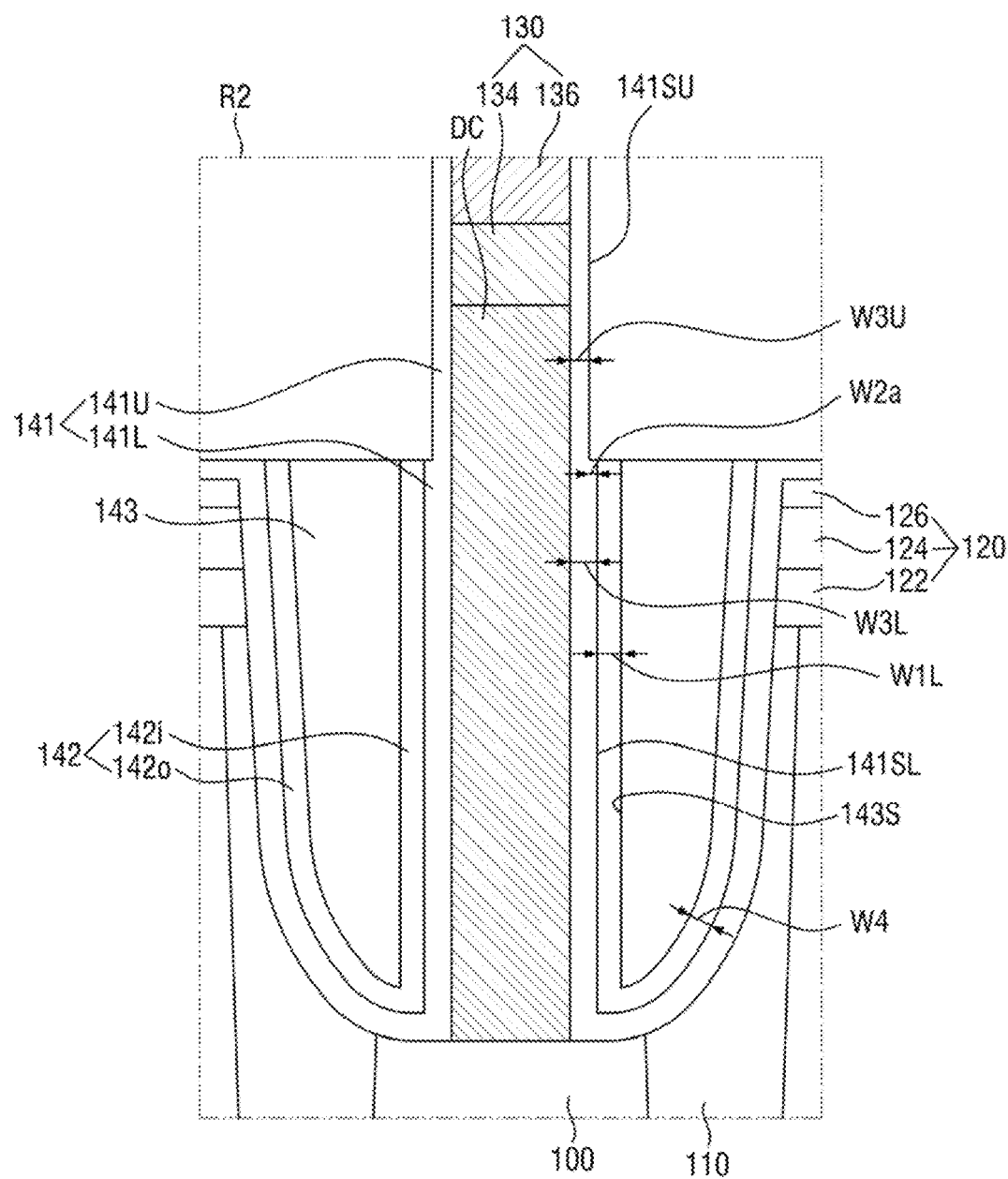

Referring to FIGS. 10 and 11, a portion of the second spacer 142 may be removed, and a thickness of a portion of the first spacer 141 may be reduced. For reference, FIG. 11 is an expanded view enlarging a R2 region of FIG. 10.

For example, a portion of the second spacer 142 which extends along a side surface and an, upper surface of the bit line structure 130 and an upper surface of the base insulating film 120 may, be removed. Removing the second spacer 142 may be performed by using, for example, a wet etching process of using HF, but the present inventive concept is not limited thereto.

According to an exemplary embodiment of the present inventive concept, the second spacer 142 formed within the first trench T1 may not be removed. For example, the second spacer 142 within the first trench T1 may extend along a profile of the first trench T1 on the first spacer 141. An upper surface of the third spacer 143 may be etched to be coplanar with uppermost ends of the patterned second spacer 142 and the upper surface of the first spacer 141 extending along the base insulating film 120 in the first direction (e.g., the X direction).

Subsequently, a thickness of the first spacer 141 exposed by the removed second spacer 142 may be reduced. For example, a thickness of the first spacer 141 extending along a side surface and an upper surface of the bit line structure 130 may be reduced. Reducing a thickness of the first spacer 141 may be performed by using, for example, a wet etching process of using HF, but the present inventive concept is not limited thereto. Accordingly, as illustrated in FIG. 11, a thickness W3U of the upper spacer 141U may be smaller than a thickness W3L of the lower spacer 141L.

According, to an exemplary embodiment of the present inventive concept, a width W3U of the upper spacer 141U may be equal to or less than about 20 Å. For example, a width W3U of the upper spacer 141U may be about 10 Å to about 20 Å, and a width W3L of the lower spacer 141L may be about 20.5 Å to about 27.5 Å. Preferably, a width W3U of the upper spacer 141U may be about 13 Å to about 17 Å, and a width W3L of the lower spacer 141L may be about 22 Å to 26 Å.

Removing a portion of the second spacer 142 and reducing a thickness of a portion of the first spacer 141 may be performed in-situ, but the present inventive concept is not limited thereto.

Figure 12:
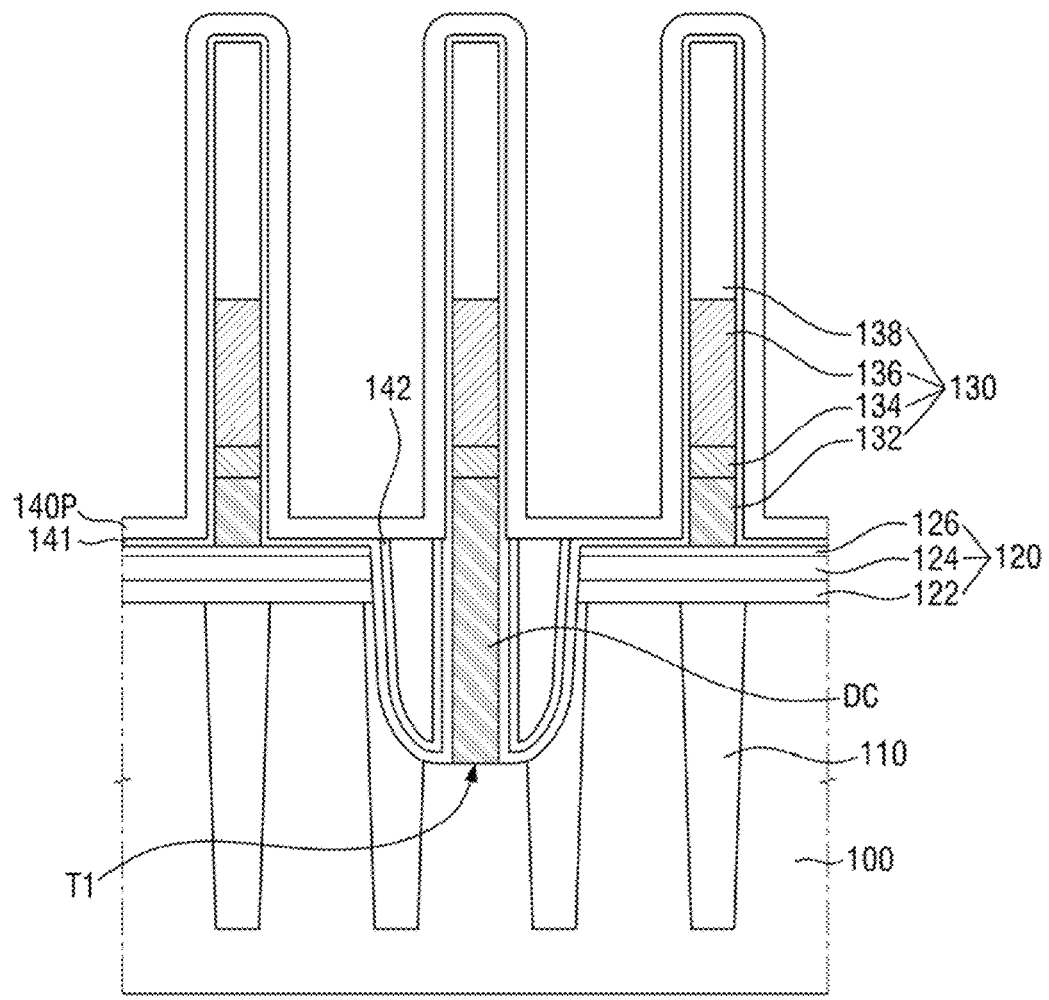

Referring to FIG. 12, a sacrificial spacer 140P may be formed on a resultant object of FIGS. 10 and 11. According to an exemplary embodiment of the present inventive concept, the sacrificial spacer 140P may be formed conformally on the exposed etched surfaces of the first spacer 141. For example, the sacrificial spacer 140P may extend along a side surface and an upper surface of the first spacer 141, exposed ends of the second spacer 142, and an upper surface of the third spacer 143.

According to an exemplary embodiment of the present inventive concept, a thickness of the sacrificial spacer 140P may be greater than a thickness of the second spacer 142.

According to an exemplary embodiment of the present inventive concept, the sacrificial spacer 140P may include a material different from a material of the first spacer 141 and the third spacer 143. For example, the sacrificial spacer 140P may include a material having a different etch selectivity with respect to an etch selectivity of the first spacer 141 and the third spacer 143. According to an exemplary embodiment of the present inventive concept, the sacrificial spacer 140P may include a same material as a material of the second spacer 142. The following will be exemplarily described below based on an assumption that the sacrificial spacer 140P includes silicon oxide.

Figure 13:
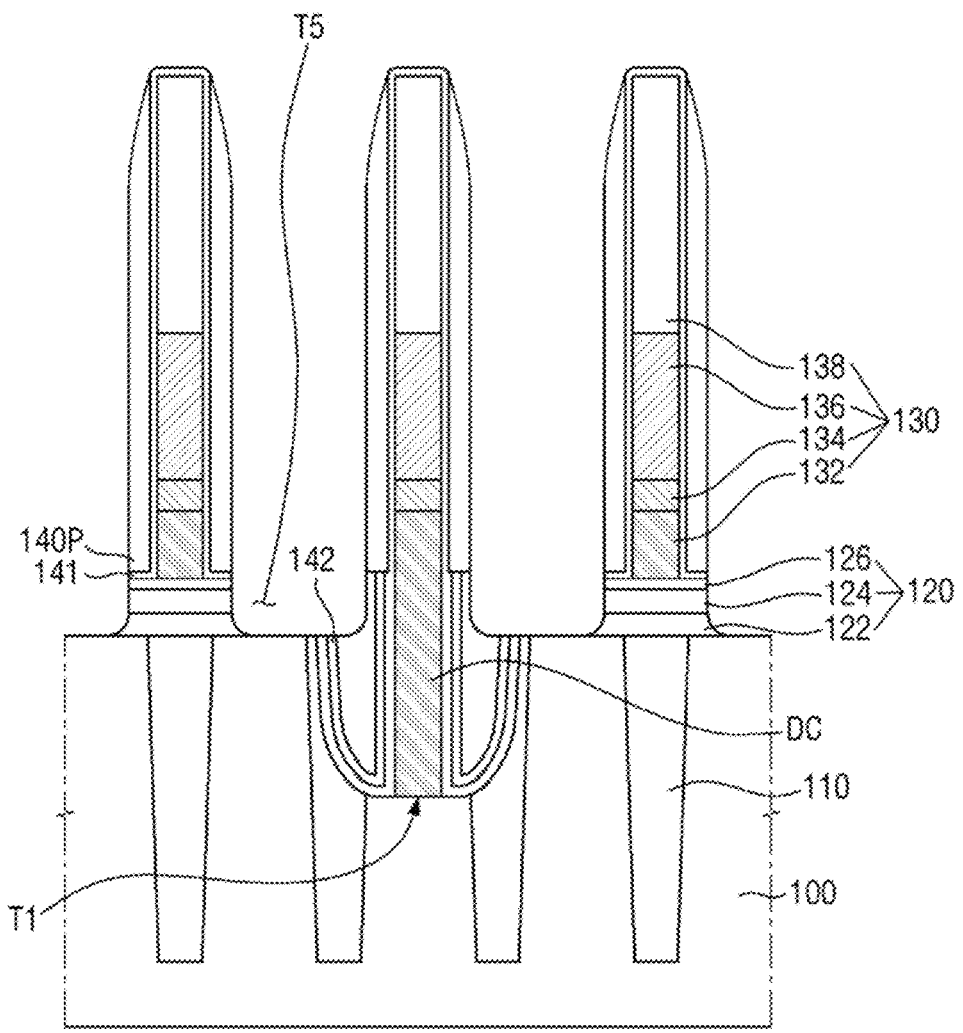

Referring to FIG. 13, a fifth trench T5 may be formed between a plurality of bit line structures 130.

According to an exemplary embodiment of the present inventive concept, a lower surface of the fifth trench T5 may be formed to be lower than an uppermost surface of the third spacer 143. For example, the fifth trench T5 may be formed within the base insulating film 120. According to an exemplary embodiment of the present inventive concept, the fifth trench T5 may expose an upper surface of the substrate 100.

In a process of forming the fifth trench T5, a portion of the sacrificial spacer 140P may be removed. For example, the sacrificial spacer 140P on an upper surface of the bit line structure 130 may be removed. A horizontal segment of the sacrificial spacer 140P extending in the first direction (e.g., the X direction) between the bit line structures 130 may be removed in addition to underlying portions of the first spacer 141, the second spacer 142, the third spacer 143 and the base insulating film 120.

Figure 14:
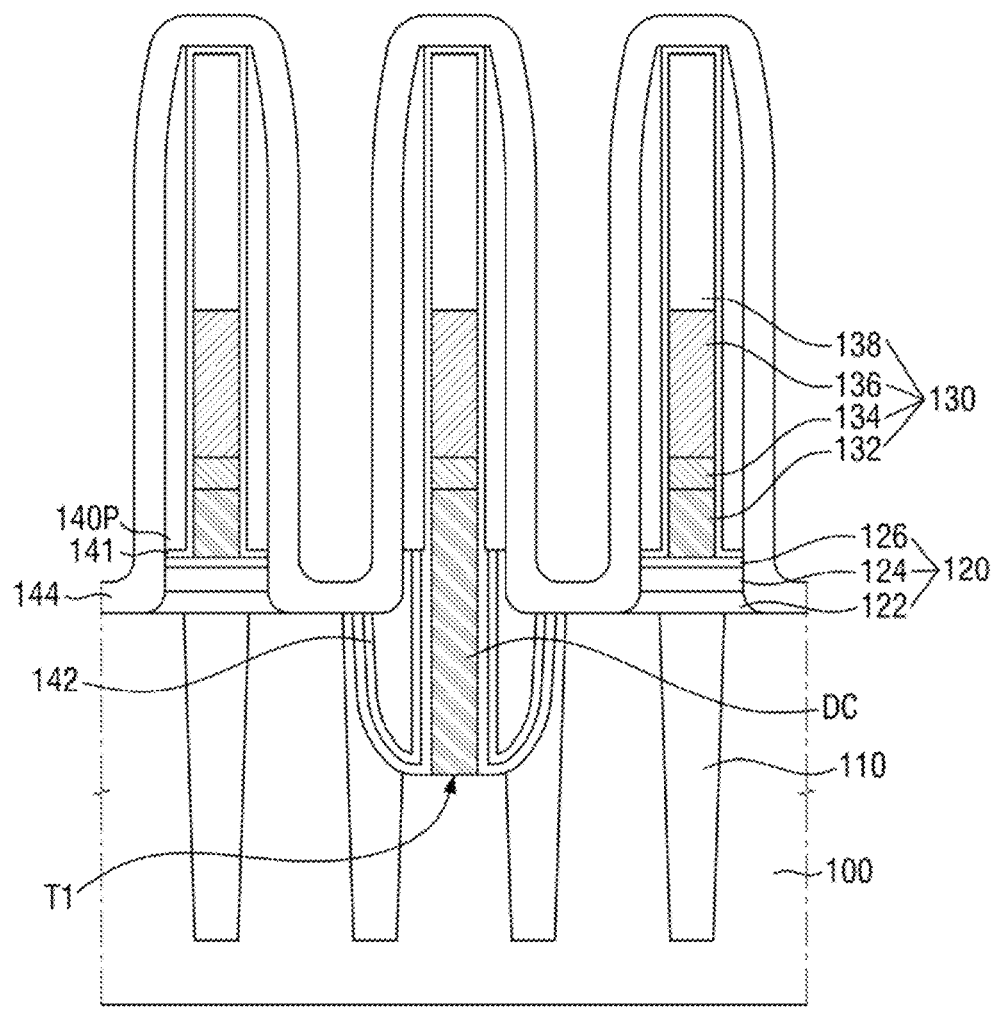

Referring to FIG. 14, the fourth spacer 144 may be formed on a resultant object of FIG. 13.

According to an exemplary embodiment of the present inventive concept, the fourth spacer 144 may be formed conformally on exposed surfaces of the substrate 100, the bit line structures 130, the first spacer 141, the second spacer 142, the third spacer 143, and the base insulating film 120. For example, the fourth spacer 144 may extend along a side surface of the sacrificial spacer 140P and a profile of the fifth trench T5.

According to an exemplary embodiment of the present inventive concept, the fourth spacer 144 may include a different material from a material of the second spacer 142 and the sacrificial spacer 140P. For example, the fourth spacer 144 may include a material having a different etch selectivity with respect to an etch selectivity of the second spacer 142 and the sacrificial spacer 140P. The following will be exemplarily described below based on an assumption that the fourth spacer 144 includes silicon nitride.

Figure 15:
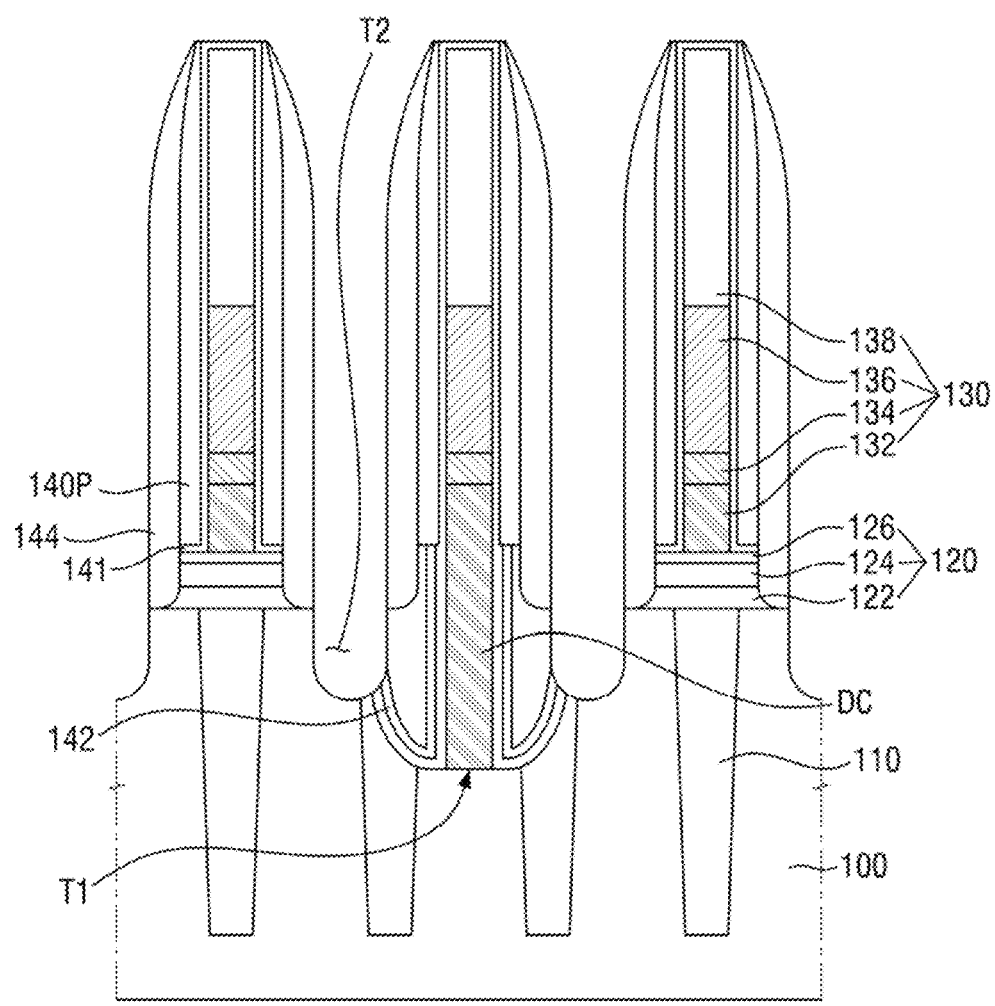

Referring to FIG. 15, the second trench T2 may be formed between a plurality of bit line structures 130. The second trench T2 may extend from the fifth trench T5 in the thickness direction towards the substrate 100 and may be narrower in the first direction (e.g., the X direction). For example, the second trench T2 may be formed through a flat lowermost portion of the fourth spacer 144 disposed in the fifth trench T5 in between vertical portions of the fourth spacer 144 covering sidewalls of adjacent bit line structures 130.

According to, an exemplary embodiment of the present inventive concept, a lower surface of the second trench T2 may be formed to be lower than an upper surface of the substrate 100. For example, the second trench T2 may be formed within the active region AR of FIG. 1 of the substrate 100. The second trench T2 may expose a portion of the active region AR by penetrating the base insulating film 120. According to an exemplary embodiment of the present inventive concept, the second trench T2 may expose both ends of the active region AR.

Figure 16:
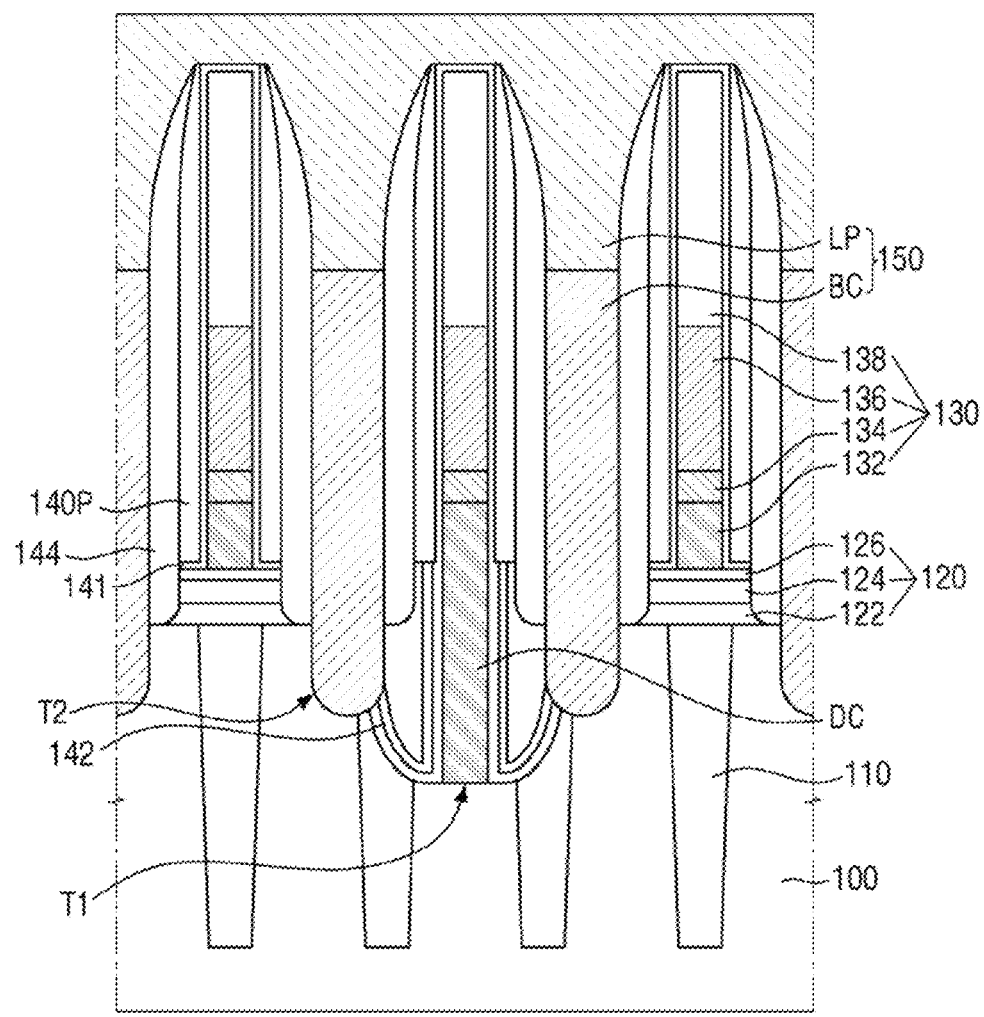

In a process of forming the second trench T2, a portion of the fourth spacer 144 may be removed. For example, the fourth spacer 144 on an upper surface of the bit line structure 130 may be removed. Referring to FIG. 16, the contact structure 150 may be formed within the second trench T2. For example, a conductive film may be formed on a resultant object of FIG. 15. Subsequently, an etchback process may be performed so that an upper surface of the conductive film is lower than an upper surface of the bit line structure 130. Accordingly, a buried contact BC forming a plurality of isolating regions may be formed in the second trench T2. The buried contact BC may include polysilicon, but the present inventive concept is not limited thereto.

Subsequently, a landing pad LP may be thrilled on the buried contact BC. According to an exemplary embodiment of the present inventive concept, an upper surface of the landing pad LP may be formed to be higher than an upper surface of the bit line structure 130. The landing pad LP may include tungsten, for example, but the present inventive concept is not limited thereto.

Figure 17:
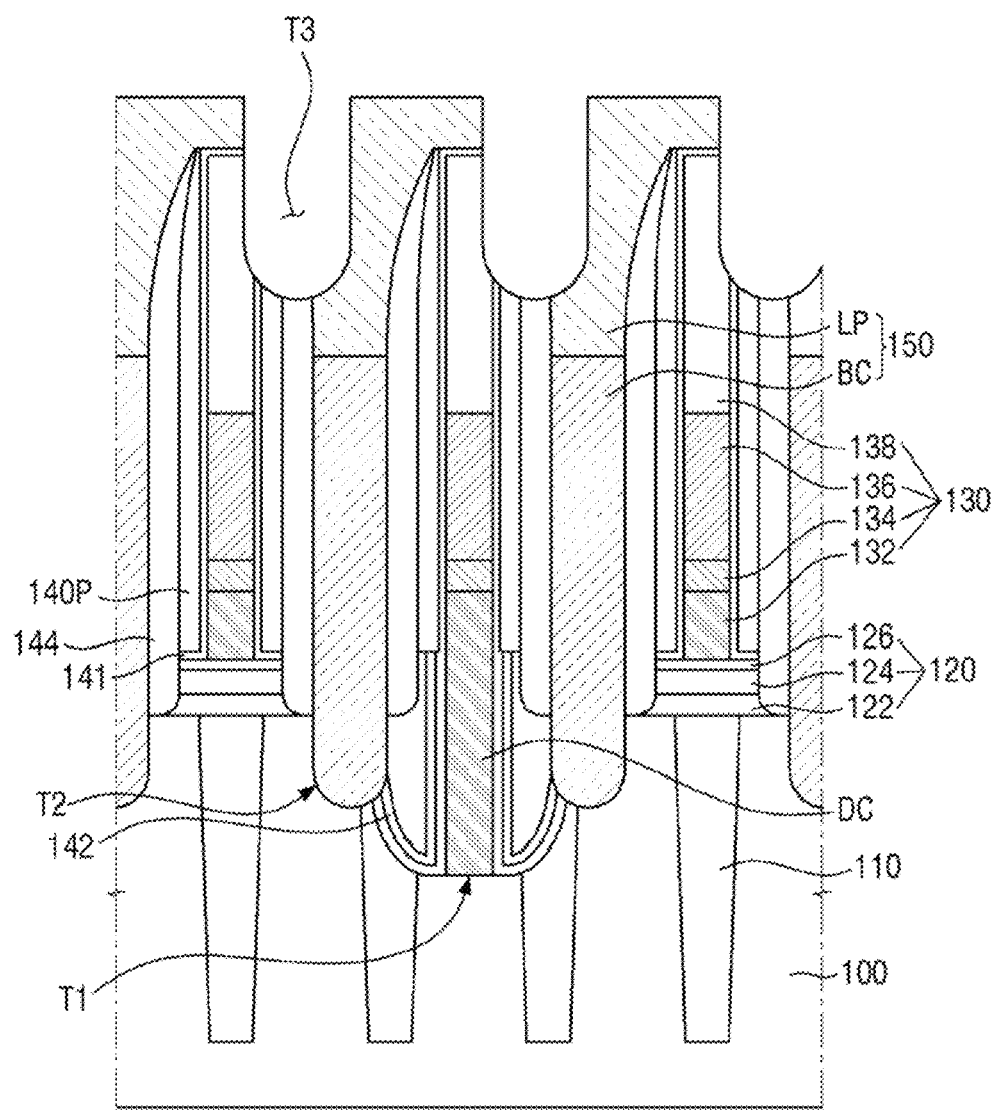

Referring to FIG. 17, the third trench T3 may be formed within the landing pad LP. In other words, the landing pad LP may be patterned by the third trench T3. Accordingly a plurality of isolating regions may be formed by the patterned landing pad LP. According to an exemplary embodiment of the present inventive concept, the third trench T3 may be formed to arrange a plurality of landing pads LP in a honeycomb structure. Accordingly, as illustrated in FIG. 1, a plurality of landing pads LP arranged in the honeycomb structure may be formed.

According to an exemplary embodiment of the present inventive concept, the third trench T3 may be formed to overlap the sacrificial spacer 140P. Accordingly, an upper portion of the sacrificial spacer 140P may be exposed by the third trench T3.

According to an exemplary embodiment of the present inventive concept, the second trench T2 may be offset from the third trench T3 in the first direction (e.g., the X direction).

Figure 18:
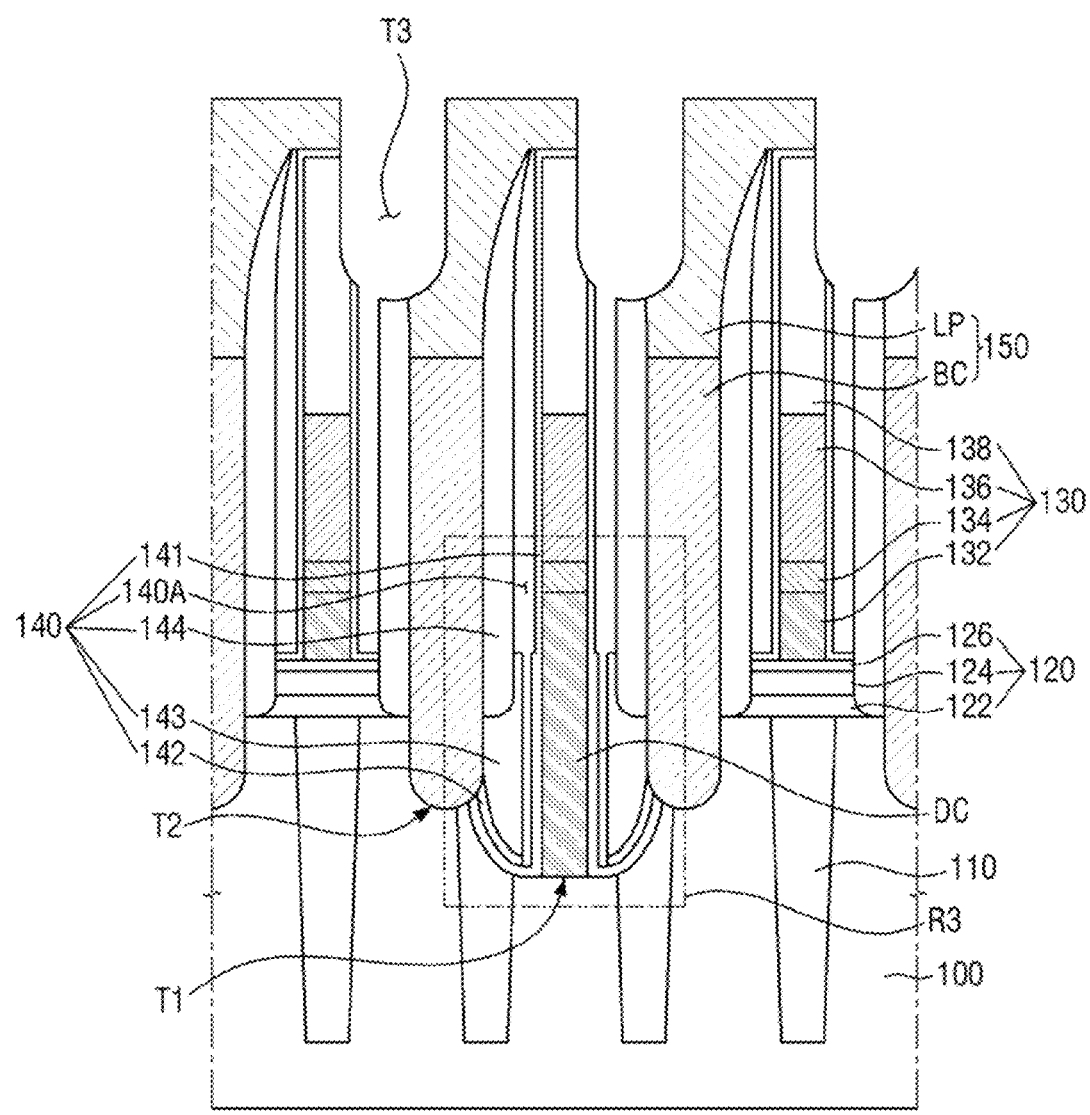
Figure 19:
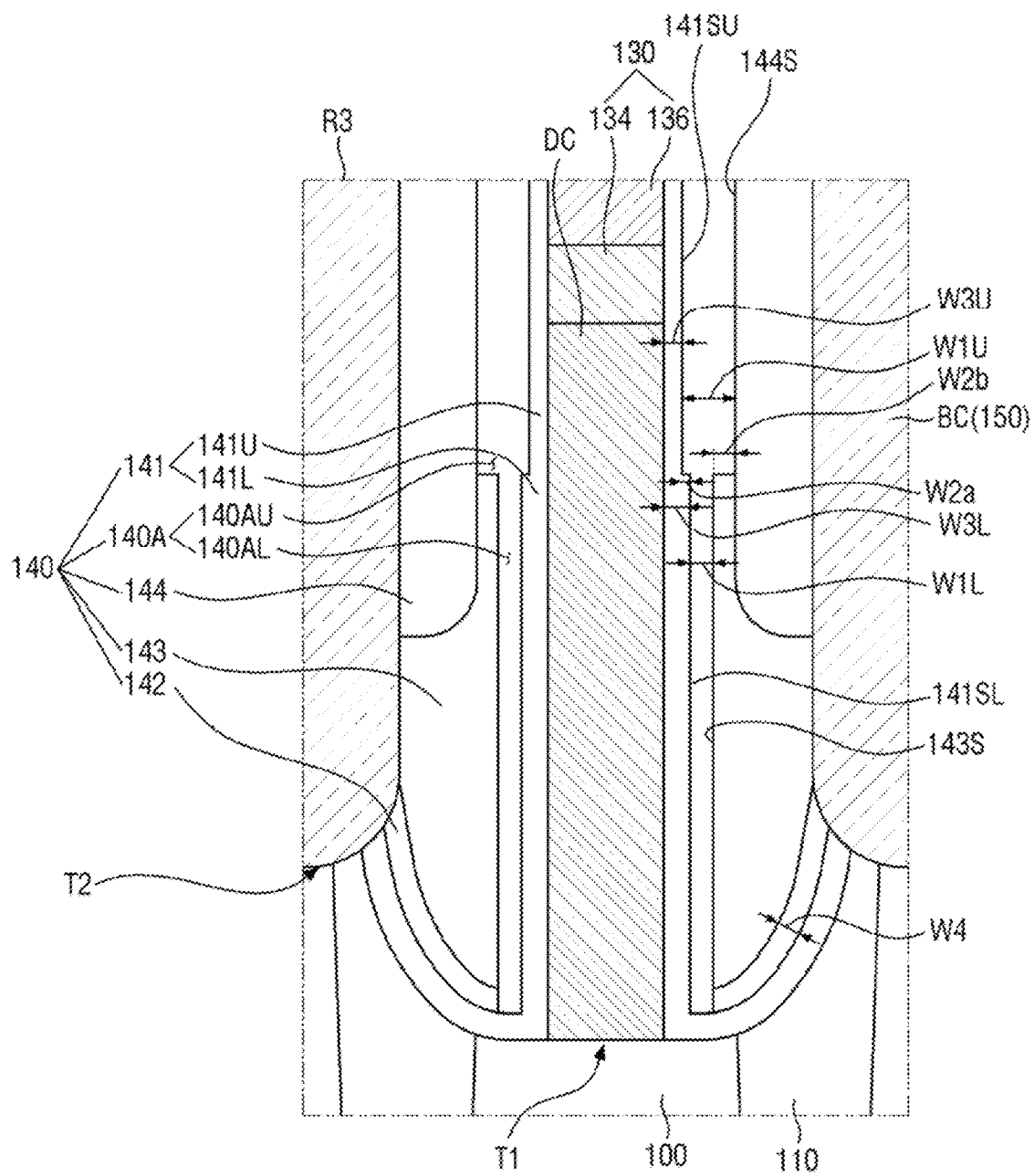

Referring to FIGS. 18 and 19, at least a portion of the second spacer 142 and the sacrificial spacer 140P may be removed to form the air spacer 140A. For reference, FIG. 19 is an enlarged view of the R3 region of FIG. 18.

For example, there may be performed an etching process for removing the sacrificial spacer 140P exposed by the third spacer 143. The etching process may include, for example, plasma dry cleaning process (PDC), but the present inventive concept is not limited thereto.

Referring to FIG. 18, after removal of the sacrificial spacer 140P, an upper portion of the second spacer 142 may be exposed. Subsequently, in a process of removing the sacrificial spacer 140P, at least a portion of the exposed second spacer 142 may be also removed (e.g., a vertical portion overlapping a sidewall of the bit line structure 130).

According to an exemplary embodiment of the present inventive concept, when a thickness of the sacrificial spacer 140P is formed thicker than a thickness of the second spacer 142, the second spacer 142 and the sacrificial spacer 140P may have a T-character shape. Accordingly, in a process of removing the sacrificial spacer 140P, the exposed second spacer 142 may be removed more easily.

Accordingly, as illustrated in FIG. 19, at least a portion of the second spacer 142 and the sacrificial spacer 140P may be replaced with the air spacer 140A including the first portion 140AL and the second portion 140AU. According to an exemplary embodiment of the present inventive concept, as a thickness of the sacrificial spacer 140P may be greater than a thickness of the second spacer 142, a width W1U of the second portion 140AU of the air spacer 140A may be greater than a width W1U of the first portion 140AL of the air spacer 140A.

Figure 20:
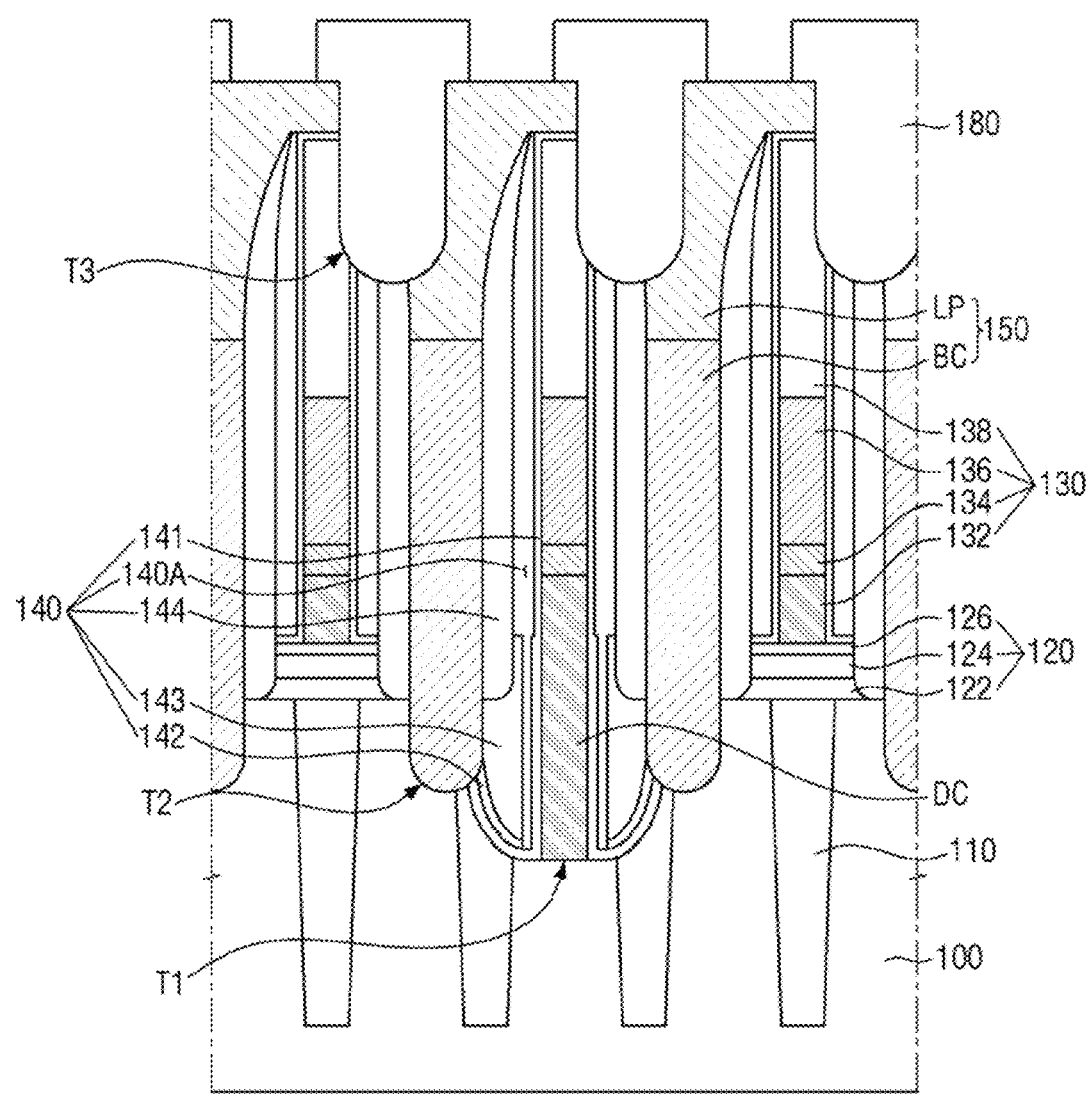

Referring to FIG. 20, the interlayer insulating film 180 may be formed on the landing pad LP. The interlayer insulating film 180 may be formed to fill the third trench T3. Accordingly, the landing pad LP may form a plurality of isolating regions which are spaced apart from one another by the interlayer insulating film 180. Further, the interlayer insulating film 180 may be patterned so as to expose a portion of an upper surface of each of the landing pads LP.

Subsequently, referring to FIGS. 1 to 4, a capacitor structure 190 may be formed on a resultant object of FIG. 20. For example, a lower electrode 192 in contact with the landing pad LP and exposed by the interlayer insulating film 180 may be formed. Next, a capacitor dielectric film 194 and an upper electrode 196 may be sequentially formed on the lower electrode 192. Accordingly, there may be provided a method for fabricating the semiconductor device enhanced with operating characteristic according to an exemplary embodiment of the present inventive concept.

While exemplary embodiments of the present inventive concept have been described with reference to the figures, it will be understood by those of ordinary skill in the art that various changes in form and details may be made therein without departing from the spirit and scope of the present inventive concept as defined by the following claims.

What is claimed is:

1. A semiconductor device, comprising:
a substrate comprising a trench;
a first conductive pattern disposed within the trench, the first conductive pattern having a width smaller than a width of the trench;
a first spacer extended along at least a portion of a side surface of the first conductive pattern and the trench;
a second spacer at least partially filling the trench adjacent to the first spacer; and
an air spacer comprising a first portion between the first spacer and the second spacer, and a second portion disposed on the second spacer and the first portion,
wherein a width of the second portion of the air spacer is greater than a width of the first portion of the air spacer, and
wherein the second portion of the air spacer is protruded into the first spacer at a stepped interface between the second portion of the air spacer and the first portion of the air spacer.

2. The semiconductor device of claim 1, wherein the first spacer comprises a lower spacer between the first conductive pattern and the first portion of the air spacer, and an upper spacer between the first conductive pattern and the second portion of the air spacer,
wherein a width of the upper spacer of the first air spacer is less than a width of the lower spacer of the first spacer.

3. The semiconductor device of claim 2, wherein the width of the upper spacer of the first spacer is 20 Å or less.

4. The semiconductor device of claim 1, wherein the width of the first portion of the air spacer is 15 Å or more.

5. The semiconductor device of claim 1, further comprising a third spacer spaced apart from the first spacer by the second portion of the air spacer.

6. The semiconductor device of claim 5, wherein a side surface of the second spacer adjacent to the first spacer is nearer to the first conductive pattern than a side surface of the third spacer adjacent to the first spacer.

7. The semiconductor device of claim 5, wherein a lower surface of the third spacer is lower than a lower surface of the second portion of the air spacer in a direction towards the substrate.

8. The semiconductor device of claim 1, wherein the substrate comprises an active region and a device isolation film defining the active region, and
wherein the first conductive pattern is in contact with the active region.

9. The semiconductor device of claim 8, further comprising a second conductive pattern that traverses the active region and extends in a first direction within the substrate,
wherein the first conductive pattern traverses the active region and extends in a second direction intersecting the first direction.

10. The semiconductor device of claim 1, wherein the first spacer and the second spacer comprise silicon nitride.

11. The semiconductor device of claim 1, further comprising:
a contact structure in contact with the substrate and spaced apart from the first conductive pattern by the first spacer, the air spacer, and the second spacer; and
a capacitor structure in contact with the contact structure.

12. A semiconductor device, comprising:
a substrate comprising a trench;
a conductive pattern disposed within the trench, the conductive pattern having a width smaller than a width of the trench;
a first spacer that extends along at least a portion of a side surface of the conductive pattern and the trench;
a second spacer at least partially filling the trench and disposed on the first spacer; and
an air spacer comprising a first portion between the first spacer and the second spacer and a second portion disposed on the second spacer and the first portion,
wherein the first spacer comprises a lower spacer between the conductive pattern and the first portion of the air spacer and an upper spacer between the conductive pattern and the second portion of the air spacer, and wherein a width of the upper spacer of the first spacer is less than a width of the lower spacer of the first spacer.

13. The semiconductor device of claim 12, wherein a width of the second portion of the air spacer is greater than a width of the first portion of the air spacer.

14. The semiconductor device of claim 12, further comprising a third spacer spaced apart from the first spacer by the second portion of the air spacer on, the second spacer.

15. The semiconductor device of claim 14, wherein a distance from a side surface of the upper spacer opposite to the third spacer to a side surface of the lower spacer opposite to the second spacer is different from a distance from a side surface of the third spacer opposite to the upper spacer to a side surface of the second spacer opposite to the lower spacer.

16. The semiconductor device of claim 12, wherein a bit line structure of the conductive pattern extends in a first direction, and wherein the air spacer has a T shape in a cross section intersecting the first direction.

17. A semiconductor device, comprising:

a substrate comprising a trench;

a conductive pattern disposed within the trench, the conductive pattern having a width, smaller than a width of the trench;

a first spacer extending along at least a portion of a side surface of the conductive pattern and the trench; and an air spacer displaced from the conductive pattern by the first spacer, the air spacer extending along at least a portion of the first spacer, wherein the air spacer has a T shape in a cross section, and wherein a portion of the air spacer is formed within the trench.

18. The semiconductor device of claim 17, further comprising a contact structure contact with the substrate and spaced apart from a bit line structure of the conductive pattern by the first spacer and the air spacer.

19. The semiconductor device of claim 18, wherein the contact structure comprises a buried contact and a landing pad disposed on the buried contact, wherein the buried contact is in contact with the substrate and including an upper surface that is lower than an upper surface of the bit line structure, and wherein the landing pad has an upper surface that is higher than the upper surface of the bit line structure.

20. The semiconductor device of claim 19, further comprising a capacitor structure in contact with the landing pad on the bit line structure.

* * * * *